US011542600B2

(12) United States Patent
Pore et al.

(10) Patent No.: US 11,542,600 B2
(45) Date of Patent: Jan. 3, 2023

(54) SYNTHESIS AND USE OF PRECURSORS FOR ALD OF GROUP VA ELEMENT CONTAINING THIN FILMS

(71) Applicant: ASM IP HOLDING B.V., Almere (NL)

(72) Inventors: Viljami Pore, Helsinki (FI); Timo Hatanpää, Espoo (FI); Mikko Ritala, Espoo (FI); Markku Leskelä, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 17/173,467

(22) Filed: Feb. 11, 2021

(65) Prior Publication Data

US 2021/0164101 A1   Jun. 3, 2021

Related U.S. Application Data

(60) Continuation of application No. 16/835,933, filed on Mar. 31, 2020, now Pat. No. 10,941,487, which is a
(Continued)

(51) Int. Cl.
*H01L 21/00* (2006.01)
*C23C 16/455* (2006.01)
(Continued)

(52) U.S. Cl.
CPC ........ *C23C 16/45553* (2013.01); *C23C 16/18* (2013.01); *C23C 16/305* (2013.01);
(Continued)

(58) Field of Classification Search
CPC .......... H01L 21/02538; H01L 21/0262; C23C 16/18; C23C 16/45553
See application file for complete search history.

(56) References Cited

U.S. PATENT DOCUMENTS 5,698,869 A   12/1997 Yoshimi et al.
6,534,395 B2   3/2003 Werkhoven et al.
(Continued)

FOREIGN PATENT DOCUMENTS

EP   0568074   4/1993
EP   1 995 236   11/2008
(Continued)

OTHER PUBLICATIONS

SciFinder entry for hexamethyldisilyltellurium, CAS Registry No. 4551-16-0, downloaded Jan. 27, 2021.
(Continued)

*Primary Examiner* — Reema Patel
(74) *Attorney, Agent, or Firm* — Knobbe, Martens, Olson & Bear LLP

(57) ABSTRACT

Atomic layer deposition (ALD) processes for forming Group VA element containing thin films, such as Sb, Sb—Te, Ge—Sb and Ge—Sb—Te thin films are provided, along with related compositions and structures. Sb precursors of the formula $Sb(SiR^1R^2R^3)_3$ are preferably used, wherein $R^1$, $R^2$, and $R^3$ are alkyl groups. As, Bi and P precursors are also described. Methods are also provided for synthesizing these Sb precursors. Methods are also provided for using the Sb thin films in phase change memory devices.

20 Claims, 22 Drawing Sheets

Related U.S. Application Data continuation of application No. 16/269,456, filed on Feb. 6, 2019, now Pat. No. 10,619,244, which is a division of application No. 15/820,188, filed on Nov. 21, 2017, now Pat. No. 10,208,379, which is a continuation of application No. 15/096,511, filed on Apr. 12, 2016, now Pat. No. 9,828,674, which is a continuation of application No. 13/504,079, filed as application No. PCT/US2010/053982 on Oct. 25, 2010, now Pat. No. 9,315,896.

(60) Provisional application No. 61/255,055, filed on Oct. 26, 2009, provisional application No. 61/308,793, filed on Feb. 26, 2010, provisional application No. 61/383,143, filed on Sep. 15, 2010.

(51) Int. Cl.
| | |
|---|---|
| *C23C 16/30* | (2006.01) |
| *H01L 21/02* | (2006.01) |
| *H01L 45/00* | (2006.01) |
| *C23C 16/18* | (2006.01) |
| *C23C 16/44* | (2006.01) |

(52) U.S. Cl.
CPC .... *C23C 16/4408* (2013.01); *C23C 16/45555* (2013.01); *H01L 21/0262* (2013.01); *H01L 21/02538* (2013.01); *H01L 21/02543* (2013.01); *H01L 21/02546* (2013.01); *H01L 21/02549* (2013.01); *H01L 45/06* (2013.01); *H01L 45/144* (2013.01); *H01L 45/148* (2013.01); *H01L 45/1616* (2013.01); *H01L 21/02521* (2013.01); *H01L 21/02551* (2013.01)

(56) References Cited

U.S. PATENT DOCUMENTS

| | | |
|---|---|---|
| 6,706,115 B2 | 3/2004 | Leskela et al. |
| 6,716,713 B2 | 4/2004 | Todd |
| 7,045,430 B2 | 5/2006 | Ahn et al. |
| 7,105,866 B2 | 9/2006 | El-Zein et al. |
| 7,235,131 B2 | 6/2007 | Nishinaga |
| 7,482,286 B2 | 1/2009 | Misra et al. |
| 7,772,073 B2 | 8/2010 | Clark et al. |
| 7,817,464 B2 | 10/2010 | Kuh et al. |
| 7,902,048 B2 | 3/2011 | Shin et al. |
| 7,960,205 B2 | 6/2011 | Xiao et al. |
| 8,318,252 B2 | 11/2012 | Xiao |
| 8,709,863 B2 | 4/2014 | Hunks et al. |
| 8,765,223 B2 | 7/2014 | Xiao et al. |
| 9,175,390 B2 | 11/2015 | Pore et al. |
| 9,315,896 B2 | 4/2016 | Pore et al. |
| 2003/0024471 A1 | 2/2003 | Talin et al. |
| 2004/0072882 A1 | 4/2004 | Johnson, Jr. et al. |
| 2005/0186342 A1 | 8/2005 | Sager et al. |
| 2005/0271812 A1 | 12/2005 | Myo et al. |
| 2005/0277063 A1 | 12/2005 | Wang et al. |
| 2006/0180811 A1 | 8/2006 | Lee et al. |
| 2007/0048977 A1 | 3/2007 | Lee et al. |
| 2007/0054475 A1 | 3/2007 | Lee et al. |
| 2007/0160760 A1 | 7/2007 | Shin et al. |
| 2007/0190807 A1 | 8/2007 | Misra et al. |
| 2007/0249086 A1 | 10/2007 | Philipp et al. |
| 2008/0017841 A1 | 1/2008 | Lee et al. |
| 2008/0026578 A1 | 1/2008 | Shenai-Khatkhate et al. |
| 2008/0093591 A1 | 4/2008 | Khang et al. |
| 2008/0096386 A1 | 4/2008 | Park et al. |
| 2008/0108175 A1 | 5/2008 | Shin et al. |
| 2008/0199381 A1 | 8/2008 | Tokumitsu |
| 2009/0074652 A1 | 3/2009 | Dussarrat |
| 2009/0085175 A1 | 4/2009 | Clark et al. |
| 2009/0112009 A1 | 4/2009 | Chen et al. |
| 2009/0124039 A1 | 5/2009 | Roeder et al. |
| 2009/0137100 A1 | 5/2009 | Xiao et al. |
| 2009/0191330 A1 | 7/2009 | Xiao |
| 2009/0215225 A1 | 8/2009 | Stender et al. |
| 2009/0242957 A1 | 10/2009 | Ma et al. |
| 2009/0280052 A1 | 11/2009 | Xiao et al. |
| 2009/0280650 A1 | 11/2009 | Lubomirsky et al. |
| 2009/0285986 A1* | 11/2009 | Park .................. C23C 16/18 427/255.4 |
| 2009/0305458 A1 | 12/2009 | Hunks et al. |
| 2010/0063166 A1 | 3/2010 | Behler |
| 2010/0104755 A1 | 4/2010 | Dussarrat et al. |
| 2010/0234642 A1 | 9/2010 | Rodak et al. |
| 2010/0317150 A1 | 12/2010 | Hunks et al. |
| 2012/0021590 A1 | 1/2012 | Ishii et al. |
| 2012/0028410 A1 | 2/2012 | Marsh |
| 2012/0171378 A1 | 7/2012 | Xiao et al. |
| 2013/0210217 A1 | 8/2013 | Xiao et al. |
| 2013/0306927 A1 | 11/2013 | Marsh et al. |
| 2015/0111392 A1 | 4/2015 | Ishii et al. |
| 2016/0222515 A1 | 8/2016 | Pore et al. |
| 2016/0372365 A1 | 12/2016 | Tang et al. |
| 2019/0006586 A1 | 1/2019 | Maes et al. |

FOREIGN PATENT DOCUMENTS

| | | |
|---|---|---|
| JP | 04-226930 | 8/1992 |
| JP | 2002-322181 | 11/2002 |
| KR | 2007-0066114 | 6/2007 |
| KR | 2008-0035864 | 4/2008 |
| WO | WO 2007/000186 | 1/2007 |
| WO | WO 2007/133837 | 11/2007 |
| WO | WO 2008/057616 | 5/2008 |
| WO | WO 2009/132207 | 10/2009 |

OTHER PUBLICATIONS

SciFinder entry for hexaethyldisilyltellurium, CAS Registry No. 14846-56-1, downloaded Jan. 27, 2021.

Bhasin et al., "Synthesis of Alkali Metal Tellurides and Ditellurides in THF and their Relative Reactivities Toward Alkyl Bromides: A Convenient Synthesis of Dialkyl Tellurides and Dialkyl Ditellurides," Indian Journal of Chemistry, Jul. 1991, vol. 30A, pp. 632-634.

Bochkarev et al. "Reaction of triethylsilanethiol and related compounds with triethylaluminum", Bulletin of the Academy of Sciences of the USSR Division of Chemical Science, Sep. 1, 1971, pp. 1881-1884.

Burger et al., 3 inorg. Nucl. Chem. Letters, 549-552 (1967).

"Can", https://www.merriam-webster.com, Merriam-Webster.com, (Jul. 17, 2020).

Choi et al., "Combined Atomic Layer and Chemical Vapor Deposition, and Selective Growth of Ge2Sb2Te5 Films on TiN/W Contact Plug," Chem. Mater., 2007, vol. 19, pp. 4387-4389.

Chong et al., "Phase Change Random Access Memory Cell with Superlattice-like Structure," Applied Physics Letters, 2006, vol. 88, pp. 122114-1 to 122114-3.

Interview; Nov. 7, 2018 (Year: 2018).

Detty et al., "Bis(trialkylsilyl) Chalcogenides. 1. Preparation and Reduction of Group 6A Oxides," J. Org. Chem., 1982, vol. 47, pp. 1354-1356.

Downs, A., "Chemistry of Aluminum, Gallium, Indium and Thallium", London: Chapman & Hall 1 993, p. 188.

Donohoe et al., 41 Tetrahedron Letters, 1327-1330 (2000).

Drake et al., "Studies of silyl and germyl Group VI species. Part IV. Dimetyl-and tetramethyl-disilyl chalcogenides and related species", Can. J. Chem., vol. 58, No. 58, Jan. 1, 1980, pp. 2161-2166.

English translation of Chinese Office Action, dated Jan. 23, 2013 in Chinese Patent Application No. 200980124332.8.

English Translation of Japanese Office Action issued in Japanese Application No. 2011-506454, dated Sep. 17, 2013.

Evans et al. "Synthesis and use of tris(trimethylsilyl)antimony for the preparation of InSb Quantum Dots" Chemistry of Materials, vol. 20, No. 18, 2008, pp. 5727-5730.

(56) References Cited

OTHER PUBLICATIONS

Extended European Search Report dated Feb. 25, 2015 in Application No. 15150242.4.
Extended Search Report dated Jan. 28, 2016 in Application No. 10828836.6, filed Oct. 25, 2010.
Groshens et al., "Low Temperature MOCVD Growth of V/VI Materials via a Me3SiNMe2 Elimination Reaction," 15th International Conference on Thermoelectrics, 1996, pp. 430-434.
Groshens et al., "Room-Temperature MOCVD of Sb2Te3 Films and Solution Precipitation of M2Te3 (M=Sb, Bi) Powders via a Novel (N,N-Dimethylamino)trimethylsilane Elimination Reaction," Chem. Mater., 1994, vol. 6, pp. 727-729.
Herzog, U., "New chalcogen derivatives of silicon possessing adamantine and noradamantane structures", Journal of Organometallic Chemistry, 2001, vol. 628, pp. 133-143.
Herzog et al., "Dimeric and trimeric diorganosilicon chalcogenides (PhRSiE) 2,3 (E=S, Se, Te; R=Ph, Me)", Journal of Organometallic Chemistry, vol. 689, No. 26, Dec. 20, 2004, pp. 4909-4916.
International Search Report and Written Opinion dated Jun. 28, 2011 in Application No. PCT/US2010/053982, filed Oct. 25, 2010.
Jang et al., "Structural Stability and Phase-Change Characteristics of Ge2Sb2Te5/SiO2 Nano-Multilayered Films," Electrochemical and Solid-State Letters, 2009, vol. 12, Issue 4, pp. H151-H154.
Kim et al., "Atomic layer deposition of GaN using GaCl3 and NH3", Jun. 30, 2009, J. Vac. Sci. Technol. A 27(4), Jul./Aug. 2009, pp. 923-928.
Lacaita, "Phase change memories: State-of-the-art, challenges and perspectives," Solid-State Electronics, 2006, vol. 50, pp. 24-31.
Lee et al., "GeSbTe Deposition for the PRAM Application," Applied Surface Science, 2007, vol. 253, pp. 3969-3976.
Lee et al., "Influences of metal, non-metal precursors, and substrates on atomic layer deposition processes for the growth of selected functional electronic materials", Coord. Chem. Rev., 2013, 23 pages.
Lehn, "Preparation of tris(trimethylsilyl)-and tris(trimethylstannyl)amines" Communications to the Editor, Jan. 1964, p. 305.
Malik et al. "Gallium arsenide nanoparticles-synthesis and characterisation" J. Mater. Chem, 2003 vol. 13, pp. 2591-2595.
Mlochowski et al., "Lithium Selenide", e-EROS Encyclopedia of Reagents for Organic Synthesis, 2001, John Wiley & Sons, Ltd.: Chichester, UK, 1 page.
Notice of Allowance dated Feb. 24, 2015 in Japanese Application No. 2011-506454.
Notice of Non-Final Rejection dated Nov. 21, 2016 in Korean Application No. 10-2012-7012997.
Office Action dated Apr. 1, 2014 in Japanese Application No. 2012-535446.
Office Action in Chinese Application No. 200980124332.8, filed Apr. 23, 2009, dated Mar. 29, 2012.
Office Action dated Oct. 21, 2014 in Japanese Application No. 2011-506454 with English Translation.
Office Action dated Jul. 17, 2014 in Chinese Application No. 201080059497.4.
Office Action dated May 12, 2015 in Taiwanese Application No. 099136501 with English Translation.
Office Action dated Mar. 25, 2015 in Chinese Application No. 201080059497.4 with English Translation.
Office Action dated Oct. 10, 2015 in Chinese Application No. 201080059497.4.
Partial Supplemental European Search Report dated Oct. 9, 2015 in Application No. 10828836.6, filed Oct. 25, 2010.
Office Action dated Jul. 26, 2018 in Application No. 15150242.4.
Syper et al., "Lithium Diselenide in Aprotic Medium—A Convenient Reagent for Synthesis of Organic Diselenides", Tetrahedron, 1988, 44(19), pp. 6119-6130.
Viljami Pore et al. "Atomic layer deposition of metal tellurides and selenides using alkylsilyl compounds of tellurium" J. Am. Chem. Soc. 2009, vol. 131 pp. 3478-3480.
V. Pore, "ALD of phase change materials Ge2Sb2Te5", ASM Meeting, Sep. 10, 2007, University of Helsinki.
V. Pore, "ALD of Sb2Te3, GeTe and Ge2Sb2Te5-phase change materials", ASM Meeting, May 15, 2008, University of Helsinki.
Pore, et al., "Atomic Layer Deposition of Antimony and its Compounds Using Dechlorosilylation Reactions of Tris(triethylsilyl)antimony", Chem. Mater. 2011, 23, pp. 247-254.
Ritala et al., "Atomic Layer Deposition of Ge2Sb2Te5 Thin Films," Microelectronic Engineering 86 (2009) pp. 1946-1949.
M. Ritala, Atomic Layer Deposition of phase change materials, 11th E\PCOS (European\Phase Change and Ovonics Symposium) 2012 Proceedings, Jul. 8-10, 2012 Tampere, Finland, downloaded http://www.epcos.org/library/papers/pdf_2012/Oral-Papers/S3-Q3.pdf, Mar. 17, 2015.
Sewing, D. et al.; "Diacyltellurides: Synthesis by Reactions of Acyl Chlorides with Bis(trialkylsilyl)tellurides. Structure Determinations of Di(1-adamantoyl)telluride and Adamantanecarbonic Anhydride," Zeitschrift fuer Anorganische und Allgemeine Chemie, 1998, vol. 624, pp. 1363-1368.
Schultz et al., "Selenium and Tellurium Chalcogenides as Mild and Efficient Reducing Agents for Alpha-Halo Ketones", Synthesis, No. 8, Aug. 1, 1998, pp. 11-37-1140.
Singh, "Organotellurium Precursors for Metal Organic Chemical Vapour Deposition (MOCVD) of Mercury Cadmium Telluride (MCT)," Polyhedron, Mar. 1996, vol. 15, Issue 5-6, pp. 745-763.
Singh, "Recent Developments in the Ligan Chemistry of Tellurium," Coordination Chemistry Reviews, Nov. 2000, vol. 209, Issue 1, pp. 49-98.
Sisido et al. "Formation of an Organotin-nitroen bond. Syntheses of tris(trialkyltin)amines", Apr. 1964, vol. 29, pp. 907-909.
Supplemental European Search Report for EP 09735227 dated Mar. 3, 2011 (7 pages).
Wells et al. "Use of tris(trimethylsily)arsine to prepare gallium arsenide and indium arsenide", Chemistry of Materials 1989, vol. 1, pp. 4-6.
Wuttig et al., "Phase-Change Materials for Rewriteable Data Storage," Nature Materials, Nov. 2007, vol. 6, pp. 824-832.

\* cited by examiner

SYNTHESIS AND USE OF PRECURSORS FOR ALD OF GROUP VA ELEMENT CONTAINING THIN FILMS

REFERENCE TO RELATED APPLICATIONS

The present application is a continuation of U.S. application Ser. No. 16/835,933, filed Mar. 31, 2020, which is a continuation of U.S. application Ser. No. 16/269,456, filed Feb. 6, 2019, now U.S. Pat. No. 10,619,244, which is a divisional of U.S. application Ser. No. 15/820,188, filed on Nov. 21, 2017, now U.S. Pat. No. 10,208,379, which is a continuation of U.S. application Ser. No. 15/096,511, filed on Apr. 12, 2016, now U.S. Pat. No. 9,828,674, which is a continuation of U.S. application Ser. No. 13/504,079, filed on Sep. 17, 2012, now U.S. Pat. No. 9,315,896, which is the U.S. National Phase of International Application PCT/US2010/053982 filed Oct. 25, 2010 and claims priority under 35 U.S.C. § 119(e) to U.S. Provisional Application No. 61/255,055 filed Oct. 26, 2009, U.S. Provisional Application No. 61/308,793 filed Feb. 26, 2010, and U.S. Provisional Application No. 61/383,143 filed Sep. 15, 2010, each of which is hereby incorporated by reference in its entirety.

PARTIES OF JOINT RESEARCH AGREEMENT

The invention claimed herein was made by, or on behalf of, and/or in connection with a joint research agreement between the University of Helsinki and ASM Microchemistry signed on Nov. 21, 2008. The agreement was in effect on and before the date the claimed invention was made, and the claimed invention was made as a result of activities undertaken within the scope of the agreement.

BACKGROUND

Field of the Invention

The present application relates generally to methods for forming thin films comprising Group VA elements (Sb, As, Bi, P, N) by atomic layer deposition. Such films may find use, for example, in phase change memory (PCM) devices and in optical storage media.

Description of the Related Art

Thin films comprising group VA elements are used in many different applications, including, for example, non-volatile phase-change memories (PCM), solar cells, III-V compounds and optical storage materials. III-V compound semiconductors can be used in many different application areas, including transistors, optoelectronics and other application areas, for example, in bipolar transistors, field effect transistors, lasers, IR detectors, LEDs, wide band gap semiconductors, quantum well or quantum dot structures, solar cells and in monolithic microwave integrated circuits. The operation of PCM cells is based on the resistivity difference between amorphous and crystalline states of the active material. A resistivity difference of more than three orders of magnitude can be obtained by many different phase change alloys. The switching in a PCM cell is generally accomplished by heating the material locally with suitable current pulses, which, depending on the intensity of the pulse, leave the material in a crystalline or amorphous state.

A wide variety of different PCM cell structures have been reported, many of which use trench or pore-like structures. Sputtering has typically been used in preparing PCM materials, but the more demanding cell structures will require better conformality and more control of the deposition process. Sputtering may be capable of forming simple pore and trench structures, however, future PCM applications will require more complicated 3-D cell structures that cannot be formed using sputtering techniques. Processes with greater precision and control, such as atomic layer deposition (ALD), will be required to make these complicated structures. Using an atomic layer deposition process provides greater precision and control over the deposition, including better conformality and better control of the composition of the deposited film.

Atomic layer deposition processes for depositing Sb-containing thin films have been limited, in part, by a lack of appropriate precursors.

A need exists, therefore, for methods for controllably and reliably forming thin films of phase change materials comprising antimony by ALD from gas phase reactants.

SUMMARY OF THE INVENTION

The present application relates generally to methods for forming thin films comprising Group VA elements (Sb, As, Bi, P) by atomic layer deposition.

Methods and compositions are also disclosed herein for synthesizing various antimony precursors comprising $Sb(SiR^1R^2R^3)_3$, wherein $R^1$, $R^2$, and $R^3$ are alkyl groups with one or more carbon atoms.

ALD methods are also disclosed herein for depositing thin films comprising antimony, along with related compositions and structures. The methods generally comprise providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a Sb containing thin film wherein the second vapor phase reactant comprises $Sb(SiR^1R^2R^3)_3$, wherein $R^1$, $R^2$, and $R^3$ are alkyl groups with one or more carbon atoms. In some embodiments the first reactant comprises antimony. In some embodiments the first reactant does not comprise oxygen.

Methods for forming Ge—Sb—Te thin films on a substrate in a reaction chamber by an ALD process are also disclosed herein. The methods generally comprise a plurality of Sb deposition cycles, each cycle comprising alternate and sequential pulses of a first precursor and a second Sb precursor comprising $Sb(SiR^1R^2R^3)_3$, wherein $R^1$, $R^2$, and $R^3$ are alkyl groups with one or more carbon atoms; a plurality of Te containing deposition cycles, each cycle comprising alternate and sequential pulses of a third precursor and a fourth precursor comprising Te; and a plurality of Ge containing deposition cycles, each cycle comprising alternate and sequential pulses of a fifth precursor and a sixth precursor comprising Ge.

Methods for forming Ge—Sb—Se thin films on a substrate in a reaction chamber by an ALD process are provided herein. The methods comprise a plurality of Sb deposition cycles, each cycle comprising alternate and sequential pulses of a first precursor and a second Sb precursor comprising $Sb(SiR^1R^2R^3)_3$, wherein $R^1$, $R^2$, and $R^3$ are alkyl groups with one or more carbon atoms; a plurality of Se containing deposition cycles, each cycle comprising alternate and sequential pulses of a third precursor and a fourth precursor comprising Se; and a plurality of Ge containing deposition cycles, each cycle comprising alternate and sequential pulses of a fifth precursor and a sixth precursor comprising Ge.

Method for making Sb precursors are provided herein. The methods comprise forming a first product by reacting a Group IA metal with a compound comprising Sb; and subsequently combining a second reactant comprising $R^1R^2R^3SiX$ with the first product, wherein $R^1$, $R^2$ and $R^3$ are alkyl groups with one or more carbon atoms and X is a halogen atom, thereby forming a compound with the formula $Sb(SiR^1R^2R^3)_3$.

Methods for making precursors comprising a group VA element are provided herein. The methods comprise forming a first product by reacting a Group IA metal with a compound comprising a group VA element; and subsequently combining a second reactant comprising $R^1R^2R^3SiX$ with the first product, wherein $R^1$, $R^2$ and $R^3$ are alkyl groups with one or more carbon atoms and X is a halogen atom, thereby forming a compound with the formula $L(SiR^1R^2R^3)_3$, wherein L is the group VA element, wherein the group VA element is As, Sb, Bi, N or P.

Methods for making precursors comprising a group VA element are provided herein. The methods comprise forming a first product by reacting a Group IA metal with a compound comprising a group VA element; and subsequently combining a second reactant comprising $R^1R^2R^3AX$ with the first product, wherein $R^1$, $R^2$ and $R^3$ are alkyl groups with one or more carbon atoms, A is Si, Sn, or Ge and X is a halogen atom, thereby forming group VA element containing compound with the formula $L(AR^1R^2R^3)_3$, wherein L is the group VA element, wherein the group VA element is As, Sb, Bi, or P.

Atomic layer deposition (ALD) processes for forming group VA element containing thin film on a substrate in a reaction chamber are provide herein. The methods comprise a plurality of Group VA element deposition cycles, each cycle comprising: providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a group VA element containing thin film wherein the second vapor phase reactant comprises $X(SiR^1R^2R^3)_3$, wherein $R^1$, $R^2$, and $R^3$ are alkyl groups with one or more carbon atoms and X is group VA element (Sb, As, Bi, P); and removing excess second reactant and reaction byproducts, if any, from the reaction chamber.

Atomic layer deposition (ALD) processes for forming As-containing thin films on a substrate in a reaction chamber are provided herein. The methods comprise a plurality of As deposition cycles, each cycle comprising: providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a As containing thin film, wherein the second vapor phase reactant comprises $As(SiR^1R^2R^3)_3$, and wherein IV, $R^2$, and $R^3$ are alkyl groups with one or more carbon atoms; and removing excess second reactant and reaction byproducts, if any, from the reaction chamber.

Atomic layer deposition (ALD) processes for forming Sb-containing thin films on a substrate in a reaction chamber are provided herein. The methods comprise a plurality of Sb deposition cycles, each cycle comprising: providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a Sb containing thin film wherein the second vapor phase reactant comprises $Sb(GeR^1R^2R^3)_3$, wherein IV, $R^2$, and $R^3$ are alkyl groups with one or more carbon atoms; and removing excess second reactant and reaction byproducts, if any, from the reaction chamber.

Atomic layer deposition (ALD) processes for forming group VA element containing thin films on a substrate in a reaction chamber are provided herein. The methods comprise a plurality of Group VA element deposition cycles, each cycle comprising: providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a group VA element containing thin film wherein the second vapor phase reactant comprises a group VA atom that is bonded to one or more of Si, Ge, or Sn and wherein the group VA element is Sb, As, Bi or P; and removing excess second reactant and reaction byproducts, if any, from the reaction chamber.

Atomic layer deposition (ALD) processes for forming thin films comprising a group VA element on a substrate in a reaction chamber are provided herein. The processes comprise a plurality of Group VA element deposition cycles, each cycle comprising: providing a pulse of a first vapor phase reactant into the reaction chamber to form no more than about a single molecular layer of the reactant on the substrate; removing excess first reactant from the reaction chamber; providing a pulse of a second vapor phase reactant to the reaction chamber such that the second vapor phase reactant reacts with the first reactant on the substrate to form a thin film comprising a group VA element, wherein the second vapor phase reactant comprises a group VA atom that is bonded to one or more of Si, Ge, or Sn, wherein the group VA element is Sb, As, Bi, N, or P, and wherein the first vapor phase reactant does not comprise a transition metal, Si, or Ge when the group VA atom in the second vapor phase reactant is N; and removing excess second reactant and reaction byproducts, if any, from the reaction chamber.

Atomic layer deposition (ALD) processes for forming nitrogen-containing thin films on a substrate in a reaction chamber are provided herein. The processes comprise a plurality of deposition cycles, each cycle comprising: providing a pulse of a first vapor phase reactant into the reaction chamber to form no more than about a single molecular layer of the reactant on the substrate, wherein the first vapor phase reactant does not comprise transition metal; removing excess first reactant from the reaction chamber; providing a pulse of a second vapor phase reactant to the reaction chamber such that the second vapor phase reactant reacts with the first reactant on the substrate to form a nitrogen containing thin film, wherein the second vapor phase reactant comprises $N(AR^1R^2R^3)_xR_{3-x}$, and wherein x is from 1 to 3, A is Si, Ge or Sn, and R, $R^1$, $R^2$, and $R^3$ can be independently selected to be linear, cyclic, branched or substituted alkyl, hydrogen or aryl groups; and removing excess second reactant and reaction byproducts, if any, from the reaction chamber.

Methods for depositing nanolaminate thin films by an atomic layer deposition (ALD) process are provided herein. The methods comprise a first deposition cycle comprising alternate and sequential pulses of a first precursor and a second precursor, the second precursor comprising $A(SiR^1R^2R^3)_x$, wherein $R^1$, $R^2$, and $R^3$ are alkyl groups with one or more carbon atoms and A is Sb, Te, or Se, wherein x is 3 when A is Sb and x is 2 when A is Te or Se; and a second deposition cycle comprising alternate and sequential pulses of a third precursor and a fourth precursor, the fourth precursor comprising $A(SiR^1R^2R^3)_x$, wherein $R^1$, $R^2$, and $R^3$ are alkyl groups with one or more carbon atoms and A is Sb, Te, or Se, and wherein x is 3 when A is Sb and x is 2 when A is Te or Se.

ALD methods are also disclosed herein for depositing thin films comprising: Sb—Te, Ge—Te, Ge—Sb, Ge—Sb—Te, Al—Sb, In—Sb, Ga—Sb, Zn—Sb, Co—Sb, Ga—As, As—Te, As—Se, In—As, In—Ga—As, As—S, Al—As, Bi, Bi—Te, Bi—Se, In—Bi, Sb—Bi, Ga—Bi, Al—Bi, P—Te, P—Se, In—P, Ga—P, Cu—P, Al—P, B—N, Al—N, Ga—N, In—N and combinations thereof, along with related compositions and structures.

In some embodiments, nanolaminate films can be formed comprising the materials disclosed herein. In some embodiments, nanolaminates are formed using multiple ALD cycles to deposit a first film followed by multiple ALD cycles to form a second film having a composition different from the first film.

DETAILED DESCRIPTION OF VARIOUS EMBODIMENTS

Figure 1:
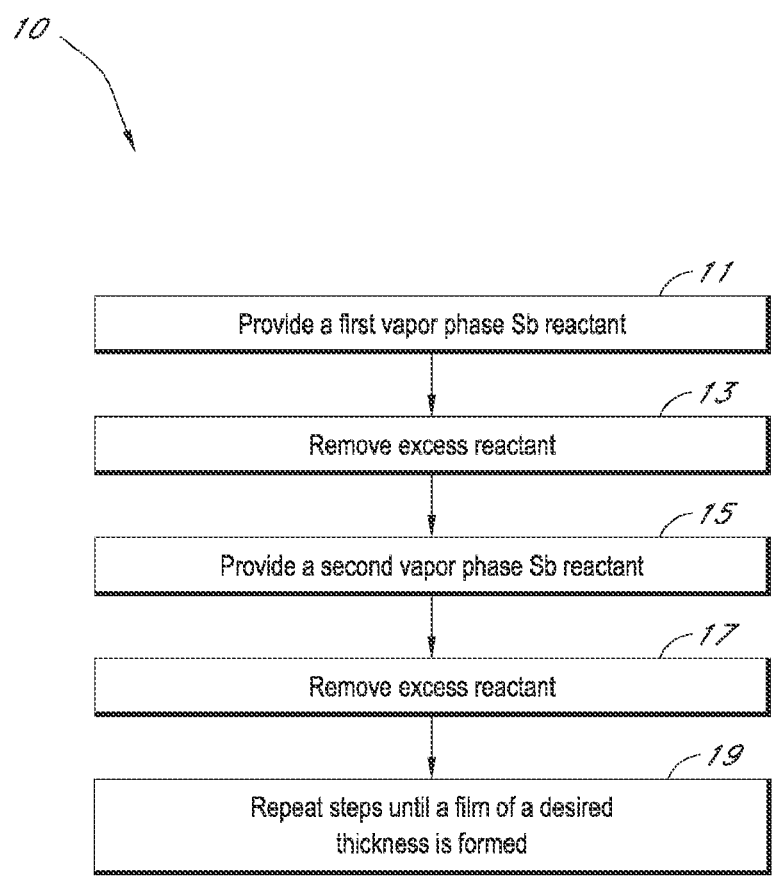
FIG. 1 a flow chart generally illustrating a method for forming a Sb film in accordance with one embodiment.

As discussed above, Sb-containing films find use in a variety of applications, including phase change memory (PCM), solar cells, and optical storage materials. PCM cells can have a variety of different configurations. Typically, the PCM cell includes a transistor and a resistor between a top metal contact and a resistive bottom electrode. Additional PCM configurations are disclosed, for example, in "Phase change memories: State-of-the-art, challenges and perspectives" by Lacaita, Solid-State Electronics 50 (2006) 24-31, which is herein incorporated by reference in its entirety. Elemental antimony can also be used as phase change material. Elemental antimony can also be used as an optical material in super-resolution near-field structures (super-RENS).

Group VA is used herein for clarity although IUPAC nomenclature now uses the term group 15. As used herein Group VA covers the elements of group 15. Group III or IIIA is used herein although IUPAC nomenclature now uses the term group 13. As used herein Group III or IIIA covers the elements of group 13. The term group III-V semiconductor covers a semiconductor with an element from group 15 and an element group 13.

The terms "film" and "thin film" are also used herein for simplicity. "Film" and "thin film" are meant to mean any continuous or non-continuous structures deposited by the methods disclosed herein. For example, "film" and "thin film" could include nanorods, nanotubes or nanoparticles.

While the embodiments disclosed herein are discussed in the general context of PCM, the skilled artisan will appreciate that the principles and advantages taught herein will have application to other devices and applications. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added.

Antimony-telluride (including $Sb_2Te$ and $Sb_2Te_3$), Germanium-telluride (including GeTe), germanium-antimony-telluride (GST; $Ge_2Sb_2Te_5$), bismuth-telluride Bi—Te (including $Bi_2Te_3$), and zinc-telluride (including ZnTe) thin films can be deposited on a substrate by atomic layer deposition (ALD) type processes. Methods and precursors for depositing thin films comprising Te and Se are disclosed in Applications No. 61/048,077, filed on Apr. 25, 2008; 61/112,128, filed Nov. 6, 2008; 61/117,896, filed Nov. 25, 2008; and Ser. No. 12/429,133 filed Apr. 23, 2009, the disclosures of which are hereby incorporated in their entirety.

More precise control over the composition of the Sb-containing thin films is desired. The methods disclosed herein describe ALD cycles for depositing elemental antimony films. The elemental antimony cycles can be used with other ALD cycles to deposit a thin film with a precise antimony composition to achieve a thin film with desired properties.

Antimony has several oxidation states, including −3, +3, 0 and +5, of which +3 is most common. Tellurium has several oxidation states, including −2, 0, +2, +4, and +6. A stoichiometric Sb—Te film with Te in a −2 oxidation state comprises $Sb_2Te_3$. Germanium (Ge) has oxidation states of 0, +2, and +4.

Tellurium (Te) compounds, where Te has an oxidation state of −2, are generally called tellurides. Tellurium compounds, where Te has an oxidation state of 0, are generally called tellurium compounds. These oxidation states in many Te compounds can be just nominal or formal expressions, in reality the situation might be more complex. However, for the sake of simplicity, as used herein thin films comprising Te are referred to as tellurides. Thus films referred to as tellurides herein may contain Te with oxidations states other than −2, for example, oxidation states of 0, +2, +4, and +6. It will be apparent to the skilled artisan when a particular oxidation state is intended.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the type of film being deposited and is preferably at or below about 400° C., more preferably at or below about 200° C. and most preferably from about 20° C. to about 200° C.

A first reactant is conducted or pulsed into the chamber in the form of a vapor phase pulse and contacted with the surface of the substrate. Conditions are preferably selected such that no more than about one monolayer of the first reactant is adsorbed on the substrate surface in a self-limiting manner. The appropriate pulsing times can be readily determined by the skilled artisan based on the particular circumstances. Excess first reactant and reaction byproducts, if any, are removed from the reaction chamber, such as by purging with an inert gas.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant is pulsed into the chamber where it reacts with the first reactant bound to the surface. Excess second reactant and gaseous byproducts of the surface reaction, if any, are removed from the reaction chamber, preferably by purging with the aid of an inert gas and/or evacuation. The steps of pulsing and purging are repeated until a thin film of the desired thickness has been formed on the substrate, with each cycle leaving no more than a molecular monolayer. Additional phases comprising provision of a reactant and purging of the reaction space can be included to form more complicated materials, such as ternary materials.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. The optimum pulsing time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

The examples descried herein illustrate certain preferred embodiments. They were carried out in an F-120™ ALD reactor supplied by ASM Microchemistry Oy, Espoo.

Sb Precursors for Atomic Layer Deposition

Precursors that may be used in various ALD processes disclosed herein are discussed below.

In some embodiments Sb precursors that may be used include, Sb halides, such as $SbCl_3$ and $SbI_3$, Sb alkoxides, such as $Sb(OEt)_3$ and Sb amides.

In some embodiments the Sb precursor has Sb bound to three silicon atoms. For example it can have a general formula of $Sb(AR^1R^2R^3)_3$, wherein A is Si or Ge, and $R^1$, $R^2$, and $R^3$ are alkyl groups comprising one or more carbon atoms. Each of the $R^1$, $R^2$ and $R^3$ ligands can be selected independently of each other. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Sb precursor have a general formula of $Sb(SiR^1R^2R^3)_3$, wherein $R^1$, $R^2$, and $R^3$ are alkyl groups comprising one or more carbon atoms. In some embodiments, $R^1$, $R^2$ and/or $R^3$ can be unsubstituted or substituted $C_1$-$C_2$ alkyls, such as methyl or ethyl groups. The $R^1$, $R^2$, and $R^3$ alkyl groups can be selected independently of each other in each ligand based on the desired physical properties of the precursor such as volatility, vapor pressure, toxicity, etc. In some embodiments the Sb precursor is $Sb(SiMe_2{}^tBu)_3$. In other embodiments the precursor is $Sb(SiEt_3)_3$ or $Sb(SiMe_3)_3$. In more preferred embodiments the precursor has a Sb—Si bond and most preferably a three Si—Sb bond structure.

In some embodiments the Sb precursor has a general formula of $Sb[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments one or more $R^1$, $R^2$, $R^3$, $R^4$, $R^5$, $R^6$, $R^7$, $R^8$, and $R^9$ can be halogen atoms. In some embodiments $X^1$, $X^2$, and $X^3$ can be Si, Ge, N, or O. In some embodiments $X^1$, $X^2$, and $X^3$ are different elements. In embodiments when X is Si then Si will be bound to three R groups, for example $Sb[Si(SiR^1R^2R^3)_3][Si(SiR^4R^5R^6)_3][Si(SiR^7R^8R^9)_3]$. In embodiments when X is N then nitrogen will only be bound to two R groups $Sb[Si(NR^1R^2)_3][Si(NR^3R^4)_3][Si(NR^5R^6)_3]$. In embodiments when X is O, the oxygen will only be bound to one R group, for example $Sb[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

In some embodiments, the Sb precursor is selected from the group consisting of: $Sb[Si(SiR^1R^2R^3)_3][Si(SiR^4R^5R^6)_3][Si(SiR^7R^8R^9)_3]$, $Sb[Si(NR^1R^2)_3][Si(NR^3R^4)_3][Si(NR^5R^6)_3]$, $Sb[Si(OR^1)_3][Si(OR^2)_3][Si(OR^3)_3]$, and $Sb[SiR^1R^2][SiR^3R^4][SiR^5R^6]$ with a double bond between silicon and one of the R groups. In other embodiments the Sb precursor comprises: a ring or cyclical configuration comprising a Sb atom and multiple Si atoms; or comprises more than one Sb atom. In these embodiments $R^1$, $R^2$, $R^3$, $R^4$, $R^5$ and $R^6$, are selected from the group consisting of alkyl, hydrogen, alkenyl, alkynyl, or aryl groups.

In some embodiments the Sb precursor has a formula similar to the formulas described above, however the Si atom has a double bond to one of the R groups in the ligand (e.g. Sb—Si=). For example, a partial structure of the precursor formula is represented below:

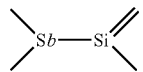

In some embodiments the precursor contains multiple atoms of Si and Sb. For example, a partial structure of a precursor in one embodiment is represented below:

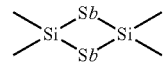

The Si and Sb atoms in the partial formulas pictured above can also be bound to one or more R groups. In some embodiments, any of the R groups described herein can be used.

In some embodiments the precursor contains a Si—Sb—Si bond structure in a cyclical or ring structure. For example, a partial structure of a precursor in one embodiment is represented below.

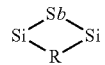

The R group can comprise an alkyl, alkenyl, alkynyl, alkylsilyl, alkylamine or alkoxide group. In some embodiments the R group is substituted or branched. In some embodiments the R group is not substituted and/or is not branched. The Si and Sb atoms in the partial formula pictured above can also be bound to one or more R groups. In some embodiments, any of the R groups described herein can be used.

As Precursors for Atomic Layer Deposition

Precursors comprising As that are similar to the precursors comprising Sb, described herein can be used. Formally As have oxidation state −III in compounds described herein.

In some embodiments the As precursor has As bound to three silicon atoms. For example it can have a general formula of $As(AR^1R^2R^3)_3$, wherein A is Si or Ge, and $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the As precursor have a general formula of $As(SiR^1R^2R^3)_3$, wherein $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In more preferred embodiments the precursor has an As—Si bond and most preferably a three Si—As bond structure. In some embodiments the As precursor is $As(SiMe_2{}^tBu)_3$. In other embodiments the precursor is $As(SiEt_3)_3$ or $As(SiMe_3)_3$. For example, $As(SiMe_3)_3$ is commercially available and can be used in some embodiments.

In some embodiments the As precursor has a general formula of $As[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments one or more $R^1$, $R^2$, $R^3$, $R^4$, $R^5$, $R^6$, $R^7$, $R^8$, and $R^9$ can be halogen atoms. In some embodiments $X^1$, $X^2$, and $X^3$ can be Si, Ge, N, or O. In some embodiments $X^1$, $X^2$, and $X^3$ are different elements. In embodiments when X is Si then Si will be bound to three R groups, for example $As[Si(SiR^1R^2R^3)_3][Si(SiR^4R^5R^6)_3][Si(SiR^7R^8R^9)_3]$. In embodiments when X is N then nitrogen will only be bound to two R groups $As[Si(NR^1R^2)_3][Si(NR^3R^4)_3][Si(NR^5R^6)_3]$. In embodiments when X is O, the oxygen will only be bound to one R group, for example $As[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

Bi Precursors for Atomic Layer Deposition

Precursors comprising Bi that are similar to the precursors comprising Sb, described herein can be used. Formally oxidation state of Bi can be either −III or +III in compounds described herein as the electronegativity of Bi is close to Si electronegativity. It must be emphasized that the oxidation state values are just formal, like in As case.

In some embodiments the Bi precursor has Bi bound to three silicon atoms. For example it can have a general formula of $Bi(AR^1R^2R^3)_3$, wherein A is Si or Ge, and $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Bi precursor have a general formula of $Bi(SiR^1R^2R^3)_3$, wherein $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In more preferred embodiments the precursor has a Bi—Si bond and most preferably a three Si—Bi bond structure. In some embodiments the Bi precursor is $Bi(SiMe_2{}^tBu)_3$. In other embodiments the precursor is $Bi(SiEt_3)_3$ or $Bi(SiMe_3)_3$.

In some embodiments the Bi precursor has a general formula of $Bi[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments one or more $R^1$, $R^2$, $R^3$, $R^4$, $R^5$, $R^6$, $R^7$, $R^8$, and $R^9$ can be halogen atoms. In some embodiments $X^1$, $X^2$, and $X^3$ can be Si, Ge, N, or O. In some embodiments $X^1$, $X^2$, and $X^3$ are different elements. In embodiments when X is Si then Si will be bound to three R groups, for example $Bi[Si(SiR^1R^2R^3)_3][Si(SiR^4R^5R^6)_3][Si(SiR^7R^8R^9)_3]$. In embodiments when X is N then nitrogen will only be bound to two R groups $Bi[Si(NR^1R^2)_3][Si(NR^3R^4)_3][Si(NR^5R^6)_3]$. In embodiments when X is O, the oxygen will only be bound to one R group, for example $Bi[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

P Precursors for Atomic Layer Deposition

Precursors comprising P that are similar to the precursors comprising Sb described herein can be used. Formally P have oxidation state −III in compounds described herein.

In some embodiments the P precursor has P bound to three silicon atoms. For example it can have a general formula of $P(AR^1R^2R^3)_3$, wherein A is Si or Ge, and $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the P precursor have a general formula of $P(SiR^1R^2R^3)_3$, wherein $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In more preferred embodiments the precursor has a P—Si bond and most preferably a three Si—P bond structure. In some embodiments the P precursor is $P(SiMe_2{}^tBu)_3$. In other embodiments the precursor is $P(SiEt_3)_3$ or $P(SiMe_3)_3$. For example, $P(SiMe_3)_3$ is commercially available and can be used in some embodiments.

In some embodiments the P precursor has a general formula of $P[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments one or more $R^1$, $R^2$, $R^3$, $R^4$, $R^5$, $R^6$, $R^7$, $R^8$, and $R^9$ can be halogen atoms. In some embodiments $X^1$, $X^2$, and $X^3$ can be Si, Ge, N, or O. In some embodiments $X^1$, $X^2$, and $X^3$ are different elements. In embodiments when X is Si then Si will be bound to three R groups, for example $P[Si(SiR^1R^2R^3)_3][Si(SiR^4R^5R^6)_3][Si(SiR^7R^8R^9)_3]$. In embodiments when X is N then nitrogen will only be bound to two R groups $P[Si(NR^1R^2)_3][Si(NR^3R^4)_3][Si(NR^5R^6)_3]$. In embodiments when X is O, the oxygen will only be bound to one R group, for example $P[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

N Precursors for Atomic Layer Deposition

Precursors comprising N that are similar to the precursors comprising Sb described herein can be used in some embodiments.

In some embodiments a N precursor has N bound to three silicon atoms. For example it can have a general formula of $N(AR^1R^2R^3)_xR_{3-x}$, wherein x is from 1 to 3, A is Si, Ge or Sn and R, $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, R, $R^1$, $R^2$ and/or $R^3$ can be hydrogen, alkenyl, alkynyl or aryl groups. In some embodiments, R, $R^1$, $R^2$, $R^3$ can be any organic groups containing heteroatoms, such as N, O, F, Si, P, S, Cl, Br or I. In some embodiments R, $R^1$, $R^2$, $R^3$ can be halogen atoms. In some embodiments R, $R^1$, $R^2$, $R^3$ are not hydrogen. In some embodiments x is 2 and R is hydrogen.

In some embodiments a N precursor has a general formula of $N(SiR^1R^2R^3)_xR_{3-x}$, wherein x is from 1 to 3, $R^1$, $R^2$, and $R^3$ are alkyl groups comprising one or more carbon atoms and R is hydrogen. The R, $R^1$, $R^2$, and $R^3$ alkyl groups can be selected independently of each other in each ligand based on the desired physical properties of the precursor such as volatility, vapor pressure, toxicity, etc. In more preferred embodiments the precursor has a N—Si bond and most preferably a three Si—N bond structure. In some embodiments the N precursor is $N(SiMe_2{}^tBu)_3$. In other embodiments the precursor is $N(SiEt_3)_3$ or $N(SiMe_3)_3$.

In some embodiments the N precursor has a general formula of $N[A^1(X^1R^1R^2R^3)_3][A^2(X^2R^4R^5R^6)_3][A^3(X^3R^7R^8R^9)_3]$ wherein $A^1$, $A^2$, $A^3$ can be independently selected to be Si, Ge or Sn and wherein $R^1$, $R^2$, $R^3$, $R^4$, $R^5$, $R^6$, $R^7$, $R^8$, and $R^9$ can be independently selected to be alkyl, hydrogen, alkenyl, alkynyl or aryl groups. In some embodiments, $R^1$, $R^2$, $R^3$, $R^4$, $R^5$, $R^6$, $R^7$, $R^8$, and $R^9$ can be any organic groups containing also heteroatoms, such as N, O, F, Si, P, S, Cl, Br or I. In some embodiments $R^1$, $R^2$, $R^3$, $R^4$, $R^5$, $R^6$, $R^7$, $R^8$, and $R^9$ are not hydrogen. In some embodiments one or more $R^1$, $R^2$, $R^3$, $R^4$, $R^5$, $R^6$, $R^7$, $R^8$, and $R^9$ can be halogen atoms. In some embodiments $X^1$ and $X^2$ can be Si, Ge, N, or O. In some embodiments $X^1$ and $X^2$ are different elements. In embodiments when X is Si then Si will be bound to three R groups, for example $N[Si(SiR^1R^2R^3)_3][Si(SiR^4R^5R^6)_3][Si(SiR^7R^8R^9)_3]$. In embodiments when X is N then nitrogen will only be bound to two R groups $N[Si(NR^1R^2)_3][Si(NR^3R^4)_3][Si(NR^5R^6)_3]$. In embodiments when X is O, the oxygen will only be bound to one R group, for example $N[Si(OR^1)_3][Si(OR^2)_3][Si(OR^3)_3]$. $R^1$, $R^2$, $R^3$, $R^4$, $R^5$, $R^6$, $R^7$, $R^8$, and $R^9$ groups can be selected independently of each other in each ligand based on the desired physical properties of the precursor such as volatility, vapor pressure, toxicity, etc.

In some embodiments the N precursor has a general formula of $N[A^1(X^1R^1R^2R^3)_3][A^2(X^2R^4R^5R^6)_3]H$ wherein $A^1$, $A^2$ can be independently selected to be Si, Ge or Sn and wherein $R^1$, $R^2$, $R^3$, $R^4$, $R^5$ and $R^6$ can be independently selected to be alkyl, hydrogen, alkenyl, alkynyl or aryl groups. In some embodiments $R^1$, $R^2$, $R^3$, $R^4$, $R^5$ and $R^6$ are not hydrogen. In some embodiments, $R^1$, $R^2$, $R^3$, $R^4$, $R^5$ and $R^6$ can be any organic groups containing also heteroatoms, such as N, O, F, Si, P, S, Cl, Br or I. In some embodiments one or more $R^1$, $R^2$, $R^3$, $R^4$, $R^5$ and $R^6$ can be halogen atoms. In some embodiments $X^1$ and $X^2$ can be Si, Ge, N, or O. In some embodiments $X^1$ and $X^2$ are different elements. In embodiments when X is Si then Si will be bound to three R groups, for example $N[Si(SiR^1R^2R^3)_3][Si(SiR^4R^5R^6)_3]H$. In embodiments when X is N then nitrogen will only be bound to two R groups $N[Si(NR^1R^2)_3][Si(NR^3R^4)_3]H$. In embodiments when X is O, the oxygen will only be bound to one R group, for example $N[Si(OR^1)_3][Si(OR^2)_3]H$. $R^1$, $R^2$, $R^3$, $R^4$, $R^5$ and $R^6$ groups can be selected independently of each other in each ligand based on the desired physical properties of the precursor such as volatility, vapor pressure, toxicity, etc.

General Description of Group VA Element Containing Precursors for Atomic Layer Deposition In some embodiments a Group VA element containing precursor has Group VA element bound to three silicon atoms. For example it can have a general formula of $L(AR^1R^2R^3)_3$, wherein L is Sb, As, Bi or P, wherein A is Si, Sn, or Ge, and $R^1$, $R^2$, and $R^3$ are alkyl groups comprising one or more carbon atoms. In some embodiments A can be Sn. Each of the $AR^1R^2R^3$-ligands can be independently selected of each other. The $R^1$, $R^2$, and $R^3$ alkyl groups can also be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$ and/or $R^3$ can be unsubstituted or substituted $C_1$-$C_2$ alkyls, such as methyl or ethyl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Group VA element containing precursor have a general formula of $L(SiR^1R^2R^3)_3$, wherein L is Sb, As, Bi or P and wherein $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments the VA precursor has a formula of L(SiMe$_2{}^t$Bu)$_3$. In other embodiments the precursor is L(SiEt$_3$)$_3$ or L(SiMe$_3$)$_3$.

In some embodiments the Group VA element containing precursor comprises a Group VA element bound to one or more of Si, Ge, and Sn. In some embodiments the Group VA element containing precursor has a Group VA element bound to one, two or three atoms selected from Si, Ge, and Sn. In some embodiments the Group VA element containing precursor comprises a Group VA element bound to two or three atoms selected from Si, Ge, and Sn, wherein there are at least two different atoms selected from Si, Ge, and Sn. In some embodiments the Group VA element containing precursor comprises a Group VA element bound to one or more Si atoms. For example, it can have a general formula of L(AR$^1$R$^2$R$^3$)$_x$R$_{3-x}$, wherein x is from 1 to 3, L is Sb, As, Bi or P, wherein A is Si, Sn, or Ge, and R, R$^1$, R$^2$, and R$^3$ are alkyl groups comprising one or more carbon atoms. In some embodiments, R$^1$, R$^2$ and/or R$^3$ can be unsubstituted or substituted C$_1$-C$_2$ alkyls, such as methyl or ethyl groups In some embodiments A can be Sn. The R, R$^1$, R$^2$, and R$^3$ alkyl groups can be selected independently of each other in each ligand based on the desired physical properties of the precursor such as volatility, vapor pressure, toxicity, etc. Each of the AR$^1$R$^2$R$^3$-ligands can also be independently selected of each other. In some embodiments, R, R$^1$, R$^2$ and/or R$^3$ can be hydrogen, alkenyl, alkynyl or aryl groups. In some embodiments, R, R$^1$, R$^2$, R$^3$ can be any organic groups containing heteroatoms, such as N, O, F, Si, P, S, Cl, Br or I. In some embodiments R, R$^1$, R$^2$, R$^3$ can be halogen atoms. In some embodiments R can be amino group. In some embodiments at least one of the ligands R, R$^1$, R$^2$, and R$^3$ is selected from linear, branched or cyclic C$_1$-C$_5$ alkyls, such as methyl, ethyl, propyl, isopropyl, butyl, isobutyl, tertbutyl, pentyl, isopentyl, tertpentyl.

In some embodiments the Group VA element containing precursor has a general formula of L(SiR$^1$R$^2$R$^3$)$_x$R$_{3-x}$, wherein L is Sb, As, Bi or P and wherein R, R$^1$, R$^2$, and R$^3$ are alkyl groups comprising one or more carbon atoms. In some embodiments, R$^1$, R$^2$ and/or R$^3$ can be unsubstituted or substituted C$_1$-C$_2$ alkyls, such as methyl or ethyl groups. The R, R$^1$, R$^2$, and R$^3$ alkyl groups can be selected independently of each other in each ligand based on the desired physical properties of the precursor such as volatility, vapor pressure, toxicity, etc. In some embodiments the VA precursor has a formula of L(SiMe$_2{}^t$Bu)$_3$. In other embodiments the precursor is L(SiEt$_3$)$_3$ or L(SiMe$_3$)$_3$. In some embodiments at least one of the ligands R, R$^1$, R$^2$, and R$^3$ is selected from linear, branched or cyclic C$_1$-C$_5$ alkyls, such as methyl, ethyl, propyl, isopropyl, butyl, isobutyl, tertbutyl, pentyl, isopentyl, tertpentyl. In some embodiments R is a linear, branched, unsubstituted or substituted alkyl, alkenyl, alkynyl, alkylsilyl, alkylamine or alkoxide group.

In some embodiments the Group VA element containing precursor comprises a Group VA element bound to one or more atoms selected from Si, Ge, Sn with a double bond similar to the Sb precursors described herein.

In some embodiments the Group VA element containing precursor has a formula similar to the formulas described above, however the Si or Ge atom, which are represented as A in the formulas below, has a double bond to one of the R groups in the ligand (e.g. A-Si=). For example, a partial structure of the precursor formula is represented below:

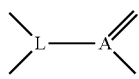

In some embodiments the precursor contains multiple Si or Ge atoms. For example, a partial structure of a precursor in one embodiment is represented below:

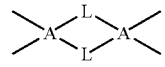

The Si or Ge and Group VA element atoms in the partial formulas pictured above can also be bound to one or more R groups. In some embodiments, any of the R groups described herein can be used.

In some embodiments the precursor contains A-L-A, wherein A is Si or Ge and wherein L is Group VA element atom, bond structure in a cyclical or ring structure. For example, a partial structure of a precursor in one embodiment is represented below.

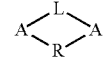

The R group can comprise an alkyl, alkenyl, alkynyl, alkylsilyl, alkylamine or alkoxide group. In some embodiments the R group is substituted or branched. In some embodiments the R group is not substituted and/or is not branched. The A and L atoms in the partial formula pictured above can also be bound to one or more R groups. In some embodiments, any of the R groups described herein can be used.

In some embodiments the Group VA element containing precursor has a general formula of L[A$^1$(X$^1$R$^1$R$^2$R$^3$)$_3$][A$^2$(X$^2$R$^4$R$^5$R$^6$)$_3$][A$^3$(X$^3$R$^7$R$^8$R$^9$)$_3$] wherein L is Sb, As, Bi or P and wherein A$^1$, A$^2$, A$^3$ can be independently selected to be Si, Sn, or Ge and wherein R$^1$, R$^2$, R$^3$, R$^4$, R$^5$, R$^6$, R$^7$, R$^8$, and R$^9$, can be independently selected to be alkyl, hydrogen, alkenyl, alkynyl or aryl groups. In some embodiments, A$^1$, A$^2$ and/or A$^3$ can be independently selected to be Sn. In some embodiments, R$^1$, R$^2$, R$^3$, R$^4$, R$^5$, R$^6$, R$^7$, R$^8$, and R$^9$ can be any organic groups containing also heteroatoms, such as N, O, F, Si, P, 5, Cl, Br or I. In some embodiments one or more R$^1$, R$^2$, R$^3$, R$^4$, R$^5$, R$^6$, R$^7$, R$^8$, and R$^9$ can be halogen atoms. In some embodiments X$^1$, X$^2$, and X$^3$ can be Si, Ge, N, or O. In some embodiments X$^1$, X$^2$, and X$^3$ are different elements. In embodiments when X is Si then Si will be bound to three R groups, for example L[Si(SiR$^1$R$^2$R$^3$)$_3$][Si(SiR$^4$R$^5$R$^6$)$_3$][Si(SiR$^7$R$^8$R$^9$)$_3$]. In embodiments when X is N then nitrogen will only be bound to two R groups L[Si(NR$^1$R$^2$)$_3$][Si(NR$^3$R$^4$)$_3$][Si(NR$^5$R$^6$)$_3$]. In embodiments when X is O, the oxygen will only be bound to one R group, for example L[Si(OR$^1$)$_3$][Si(OR$^2$)$_3$][Si(OR$^3$)$_3$]. L is Sb, As, Bi or P and R$^1$, R$^2$, R$^3$, R$^4$, R$^5$, R$^6$, R$^7$, R$^8$, and R$^9$ groups can be selected independently of each other in each ligand based on the desired physical properties of the precursor such as volatility, vapor pressure, toxicity, etc.

In some embodiments, the Group VA element containing precursor is selected from the group consisting of: L[Si(SiR$^1$R$^2$R$^3$)$_3$][Si(SiR$^4$R$^5$R$^6$)$_3$][Si(SiR$^7$R$^8$R$^9$)$_3$], L[Si(NR$^1$R$^2$)$_3$][Si(NR$^3$R$^4$)$_3$][Si(NR$^5$R$^6$)$_3$], L[Si(OR$^1$)$_3$][Si(OR$^2$)$_3$][Si(OR$^3$)$_3$], and L[SiR$^1$R$^2$][SiR$^3$R$^4$][SiR$^5$R$^6$] with a double bond between silicon and one of the R groups. In other embodiments the Sb precursor comprises: a ring or cyclical configuration comprising a Sb atom and multiple Si atoms; or comprises more than one Sb atom. In these embodiments L is Sb, As, Bi or P and R$^1$, R$^2$, R$^3$, R$^4$, R$^5$ and $R^6$, are selected from the group consisting of alkyl, hydrogen, alkenyl, alkynyl, or aryl groups.

In some embodiments the Group VA element containing precursor has a formula similar to the formulas described above, however the Si atom has a double bond to one of the R groups in the ligand (e.g. L-Si=). L is selected from the group of consisting Sb, As, Bi or P. For example, a partial structure of the precursor formula is represented below:

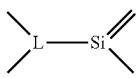

In some embodiments the precursor contains multiple atoms of Si and L. L is selected from the group of consisting Sb, As, Bi or P. For example, a partial structure of a precursor in one embodiment is represented below:

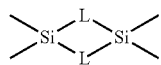

The Si and L atoms in the partial formulas pictured above can also be bound to one or more R groups. In some embodiments, any of the R groups described herein can be used.

In some embodiments the precursor contains a Si-L-Si bond structure in a cyclical or ring structure. L is selected from the group of consisting Sb, As, Bi or P. For example, a partial structure of a precursor in one embodiment is represented below.

The R group can comprise an alkyl, alkenyl, alkynyl, alkylsilyl, alkylamine or alkoxide group. In some embodiments the R group is substituted or branched. In some embodiments the R group is not substituted and/or is not branched. The Si and L atoms in the partial formula pictured above can also be bound to one or more R groups. L is selected from the group of consisting Sb, As, Bi or P. In some embodiments, any of the R groups described herein can be used.

In some embodiments, an additional precursor to be used in combination with the Group VA element containing precursors described herein, is not an oxygen source. The term "oxygen source" comprises oxygen precursors, such as water, ozone, alcohol, oxygen atoms, oxygen plasma and oxygen radicals, typically used in ALD for depositing metal oxides. In preferred embodiments the other precursor is not water, ozone, or alcohol. In some embodiments plasma is not used.

In other embodiments, the other precursor to be used in combination with the Group VA element-containing precursors described herein can also contain the same Group VA element as the Group VA-element containing precursor, such that the deposited film is an elemental film comprising the Group VA element. The other precursor may be, for example, a halide of a Group VA element, such as chloride, fluoride, bromide or iodide. In some embodiments the other precursor is $SbCl_3$ or $BiCl_3$ and the films deposited are elemental Sb or elemental Bi films, respectively.

Atomic Layer Deposition of Group VA Element Containing Thin Films

In some embodiments any of the precursors disclosed herein can be used to deposit a thin film comprising a Group VA element.

In some embodiments elemental Group VA elements are deposited. In some embodiments elemental Sb, As, Bi, or P is deposited.

In some embodiments the deposited film comprising a Group VA element comprises one or more additional elements. In some embodiments a metal, non-metal, or metalloid can also be included in the deposited thin films comprising a Group VA element.

In some embodiments the substrate temperature when depositing the thin film comprising a Group VA element is from about 20° C. to about 500° C. In some embodiments the temperature is from about 50° C. to about 400° C. In some embodiments the temperature is from about 50° C. to about 300° C.

The growth rate per cycle when depositing thin films comprising a Group VA element can vary based on the precursors used and the reactor process conditions. The growth rate per cycle as used herein refers to the average growth rate per cycle with the cycle including the provision of one pulse of two different reactants. In some embodiments the average growth rate per cycle is from about 0.05 Å/cycle to about 2.5 Å/cycle. In some embodiments the average growth rate per cycle is from about 0.1 Å/cycle to about 1.5 Å/cycle. In some embodiments the average growth rate per cycle is from about 0.2 Å/cycle to about 1.0 Å/cycle.

In some embodiments Group VA element containing thin films are doped with one or more dopants selected but not limited to those from the group consisting of O, N, C, Si, Sn, Ag, Al, Ga, P, Fe, Ge, In, Ag, Se, Te or Bi.

Atomic Layer Deposition of N Containing Thin Films

In some embodiments N precursors disclosed herein can be used to deposit a thin film comprising N. In some embodiments the thin film does not comprise a transition metal. In some embodiments one or more elements in the thin films are selected from the group consisting of elements from Groups IIIA to VIA i.e. Groups 13 to 16 according to the IUPAC. In some embodiments one or more elements in the thin films are selected from the group consisting of N, B, Al, Ga and In. In some embodiments the thin films are selected from the group consisting of BN, AlN, GaN and InN. In some embodiments the thin film comprising N is deposited that is not SiN or does not contain Si or Ge.

In some embodiments the deposited film comprising N comprises one or more additional elements. In some embodiments the deposited film comprising N is used for doping a phase change material, such as Ge—Sb—Te, with nitrogen. In some embodiments the precursor comprising N can be used in deposition cycles in combination with the Ge, Sb, and Te deposition cycles disclosed herein to deposit a thin film comprising Ge—Sb—Te doped with nitrogen.

In some embodiments the substrate temperature when depositing the thin film comprising N is from about 20° C. to about 500° C. In some embodiments the temperature is from about 50° C. to about 400° C. In some embodiments the temperature is from about 50° C. to about 300° C.

The growth rate per cycle when depositing thin films comprising N can vary based on the precursors used and the reactor process conditions. The growth rate per cycle as used herein refers to the average growth rate per cycle with the cycle including the provision of one pulse of two different reactants. In some embodiments the average growth rate per cycle is from about 0.05 Å/cycle to about 2.5 Å/cycle. In some embodiments the average growth rate per cycle is from about 0.1 Å/cycle to about 1.5 Å/cycle. In some embodiments the average growth rate per cycle is from about 0.2 Å/cycle to about 1.0 Å/cycle.

In some embodiments the N containing thin films are doped with one or more dopants selected but not limited to those from the group consisting of O, N, C, Si, Sn, Ag, Al, Ga, P, Fe, Ge, In, Ag, Se, Te or Bi.

Group VA Precursors Comprising Sn

In some embodiments the Group VA element containing precursor comprises a Group VA element bound to three tin (Sn) atoms. For example the Group VA element containing precursor can have a general formula of $L(SnR^1R^2R^3)_3$, wherein L is Sb, As, Bi or P, and $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Group VA element containing precursor have a general formula of $L(SnR^1R^2R^3)_3$, wherein L is Sb, As, Bi or P and wherein $R^1$, $R^2$, and $R^3$ are alkyl groups comprising one or more carbon atoms. The IV, $R^2$, and $R^3$ alkyl groups can be selected independently of each other in each ligand based on the desired physical properties of the precursor such as volatility, vapor pressure, toxicity, etc. In some embodiments the VA precursor has a formula of $L(SnMe_2{}'Bu)_3$. In other embodiments the precursor is $L(SnEt_3)_3$ or $L(SnMe_3)_3$.

Atomic Layer Deposition of Sb

In some embodiments, elemental antimony (Sb) films are deposited by ALD preferably without the use of plasma.

ALD deposition cycles that deposit elemental antimony are useful in a variety of applications. For example, antimony can be used in many applications including optical storage materials, semiconductor mixtures (compound, ternary, and quaternary mixtures) and non-volatile phase change memories.

The discovery of suitable Sb precursors for use in an ALD process without plasma allows for deposition of elemental antimony. In some embodiments, elemental antimony can be used as a phase change material. In some embodiments, Sb deposition cycles can also be used in combination with deposition cycles of other materials. The ratio of cycles can be selected to control the stoichiometry, including Sb content, in the deposited film to achieve a film with a desired composition and structure. For example, phase change memory films comprising Sb—Te, Ge—Sb—Te, and Ge—Sb can be deposited.

FIG. 1 is a flow chart generally illustrating a method for forming a Sb thin film 10 in accordance with one embodiment. According to some embodiments, an elemental Sb thin film is formed on a substrate in a reaction chamber by an ALD type process comprising multiple Sb deposition cycles, each deposition cycle comprising:

providing a first vapor phase reactant pulse comprising a first Sb precursor 11 into the reaction chamber to form no more than about a single molecular layer of the Sb precursor on the substrate;

removing excess first reactant from the reaction chamber 13;

providing a second vapor phase reactant pulse comprising a second Sb precursor 15 to the reaction chamber such that the second Sb precursor reacts with the first Sb precursor on the substrate to form Sb; and removing excess second reactant and reaction byproducts, if any, from the reaction chamber 17.

This can be referred to as the Sb deposition cycle. Each Sb deposition cycle typically forms at most about one monolayer of Sb. The Sb deposition cycle is repeated until a film of a desired thickness is formed 19. In some embodiments a Sb film of from about 10 Å to about 2000 Å, preferably from about 50 Å to about 500 Å is formed.

Although the illustrated Sb deposition cycle begins with provision of the first Sb precursor, in other embodiments the deposition cycle begins with the provision of the second Sb precursor. It will be understood by the skilled artisan that provision of the first Sb precursor and second Sb precursor are interchangeable in the ALD cycle.

In some embodiments, the reactants and reaction by-products can be removed from the reaction chamber by stopping the flow of Sb precursor while continuing the flow of an inert carrier gas such as nitrogen or argon.

In preferred embodiments the first Sb precursor has a formula of $SbX_3$, wherein X is a halogen element. More preferably the Sb source is $SbCl_3$, $SbBr_3$ or $SbI_3$.

In some embodiments, the other reactant to be used in combination with the $Sb(SiR^1R^2R^3)_3$ precursors described herein, is not an oxygen source. The term "oxygen source" refers to reactants that comprise oxygen, such as water, ozone, alcohol, oxygen atoms, oxygen plasma and oxygen radicals, typically used in ALD for depositing metal oxides. In preferred embodiments the other precursor is not water, ozone or alcohol.

In some embodiments the other reactant to be used in combination with the $Sb(SiR^1R^2R^3)_3$ precursors disclosed herein is not an aminogermanium precursor, such as tetraaminogermanium or organotellurium precursor. In some embodiments the other reactant to be used in combination with the $Sb(SiR^1R^2R^3)_3$ precursors disclosed herein is not a chalcogenide precursor. In some embodiments the other reactant to be used in combination with the $Sb(SiR^1R^2R^3)_3$ precursors disclosed herein does not contain plasma or an excited species. In some embodiments the other reactant to be used in combination with the $Sb(SiR^1R^2R^3)_3$ precursors disclosed herein does not contain nitrogen. In some embodiments the other reactant to be used in combination with the $Sb(SiR^1R^2R^3)_3$ precursors disclosed herein is not an alkoxide substituted precursor. In some embodiments the other reactant to be used in combination with the $Sb(SiR^1R^2R^3)_3$ precursors disclosed herein is not an amino substituted precursor. In some embodiments the other reactant to be used in combination with the $Sb(SiR^1R^2R^3)_3$ precursors disclosed herein is not an alkyl substituted precursor. In some embodiments the other reactant to be used in combination with the $Sb(SiR^1R^2R^3)_3$ precursors disclosed herein does not contain a direct Sb—C bond.

The Sb, As, Bi, N and P center atoms of the Sb, As, Bi, N and P precursors disclosed herein can be bonded to Si, Ge, or Sn atoms. Sb, As, Bi, N and P are more electronegative than Si, Ge or Sn, which will create polarity in bonds and thus a partial negative charge on the Sb, As, Bi, N and P center atoms of the Sb, As, Bi, N and P precursors disclosed herein. In some embodiments, the Sb, As, Bi, N and P center atoms can have a negative oxidation state. It is believed, although not being bound to any theory, that the slight partial negative charge of the center atom in the precursors disclosed herein, for example the slight partial negative charge of As in $As(SiEt_3)_3$ or Sb in $Sb(SiEt_3)_3$, combined with the partial positive charge of the center atom in the other precursor, for example the partial positive charge of Ga in GaCl$_3$ or Sb in SbCl$_3$, makes the precursor combination successful and film deposition, for example Ga—As or Sb film deposition, possible.

In some embodiments the other reactant to be used in combination with the Sb(SiR$^1$R$^2$R$^3$)$_3$ precursors disclosed herein is not a reducing agent, such as hydrogen, H$_2$/plasma, amine, imine, hydrazine, silane, silyl chalcogenide, germane, ammonia, alkane, alkene or alkyne. As used herein a reducing agent refers to a compound capable of reducing an atom of the other reactant, usually the atom which will be deposited in the film in an ALD process and sometimes to elemental form. At the same time the reducing agent can be oxidized. It may be noted that with oxidative chemistry, for example with an oxidation agent, it is also possible to produce elemental films if the formal oxidation states of the atom, which will be deposited, are negative in the other precursor. In some embodiments the Sb(SiR$^1$R$^2$R$^3$)$_3$ precursors disclosed herein acts as a reducing agent in an ALD process.

In some embodiments the other reactant to be used in combination with Sb(SiR$^1$R$^2$R$^3$)$_3$ precursors disclosed herein is an oxidizing precursor, such as SbCl$_3$. Preferably the oxidizing precursor is not water, alcohol or ozone. As used herein an oxidizing precursor is a precursor, which has a partial positive charge in the center atom of the molecule, such as Sb in case of SbCl$_3$ or Ga in case of GaCl$_3$, and thus center atoms can be considered to have positive oxidation states. The partial positive charge of the oxidizing precursors will be decreased in the deposited film i.e. the center atom of the molecule can be considered to be somewhat reduced although no real oxidation state increase has happened. In some embodiments the antimony deposition cycle only uses two reactive compounds.

Preferably, the second reactant is a Sb precursor with a formula of Sb(SiR$^1$R$^2$R$^3$)$_3$, wherein R$^1$, R$^2$, and R$^3$ are alkyl groups comprising one or more carbon atoms. The R$^1$, R$^2$, and R$^3$ alkyl groups can be selected based on the desired physical properties of the precursor such as volatility, vapor pressure, toxicity, etc In some embodiments the first Sb precursor is SbCl$_3$ and the second Sb precursor is Sb(SiEt$_3$)$_3$.

The substrate temperature during forming the Sb thin film deposition is preferably less than 250° C. and more preferably less than 200° C. and even more preferably below 150° C.

Pressure of the reactor can vary much depending from the reactor used for the depositions. Typically reactor pressures are below normal ambient pressure.

The skilled artisan can determine the optimal reactant evaporation temperatures based on the properties of the selected precursors. The evaporation temperatures for the second Sb precursor, such as Sb(SiEt$_3$)$_3$, which can be synthesized by the methods described herein, is typically about 85° C. The evaporation temperature for the first Sb precursor, such as SbCl$_3$, is typically about 30° C. to 35° C.

The skilled artisan can determine the optimal reactant pulse times through routine experimentation based on the properties of the selected precursors and the desired properties of the deposited Sb thin film. Preferably the first and second Sb reactants are pulsed for about 0.05 to 10 seconds, more preferably about 0.2 to 4 seconds, and most preferably about 1 to 2 seconds. The purge steps in which excess reactant and reaction by-products, if any, are removed are preferably about 0.05 to 10 seconds, more preferably about 0.2-4 seconds, and most preferably 1 to 2 seconds in length.

The growth rate of the elemental Sb thin films will vary depending on the reaction conditions. As described below, in initial experiments, the growth rate varied between about 0.3 and about 0.5 Å/cycle.

In some embodiments, a Sb thin film is deposited on a substrate and forms the active material in a PCM cell. In some embodiments, the Sb thin film is deposited on a substrate and used in a super-RENS device. The Sb thin film preferably has a thickness of about 10 Å to about 2000 Å.

In some embodiments, one or more dopants selected from the group consisting of O, N, C, Si, Sn, Ag, Al, Ga, P, Fe, Ge, In, Ag, Se, Te or Bi, but not limited to those, is introduced into film. The precursor comprising dopant reacts preferably, but not necessarily, with the Sb precursors described herein.

Example 1

Figure 3:
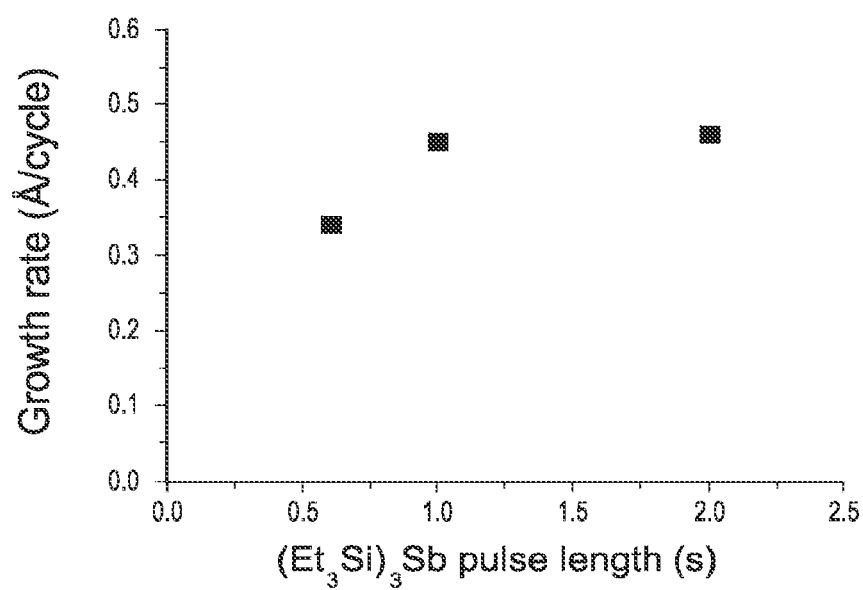
FIG. 3 is a graph of the average growth rate per cycle for Sb thin films versus precursor pulse length.

Elemental Sb thin films were formed using alternating and sequential pulses of SbCl$_3$ and Sb(SiEt$_3$)$_3$. 1000 cycles were applied. The elemental Sb thin films were formed on soda lime glass and silicon substrates with native oxide. Sb(SiEt$_3$)$_3$ is a liquid at room temperature and was evaporated from an open boat at a temperature of 85° C. The substrate temperature during deposition was 95° C. The pulse and purge length for the SbCl$_3$ precursor was 1 second and 2 seconds, respectively. The pulse length for Sb(SiEt$_3$)$_3$ was varied between 0.5 and 2.0 seconds, with a purge length of 2 seconds. FIG. 3 shows the average growth rate per cycle for Sb films deposited at 0.5, 1.0, and 2.0 second pulse lengths of (Et$_3$Si)$_3$Sb. FIG. 3 shows a maximum growth rate of around 0.45 Å/cycle. The antimony films were clear and mirror like as deposited.

Figure 4:
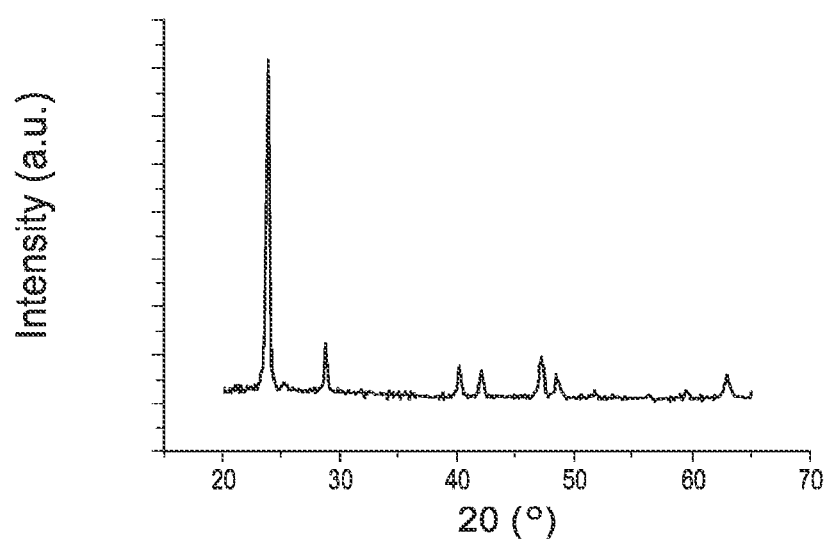
FIG. 4 is a gracing incidence x-ray diffractogram of a Sb thin film.

FIG. 4 shows a gracing incidence XRD (GIXRD) pattern of the Sb film deposited as described in reference to FIG. 3 using a 1 second (Et$_3$Si)$_3$Sb pulse length.

The GIXRD pattern shows a polycrystalline Sb film with all of the reflections identified as rhombohedral Sb (iron black, PDF 00-035-0732). The deposited film was also studied by energy dispersive x-ray (EDX) measurement. The EDX measurement confirmed that the films consisted of antimony with no chlorine present in the deposited film. Film thickness were about 45 nm.

Comparative Example 1

Deposition experiments using (Et$_3$Si)$_3$Sb+CH$_3$OH were conducted at 100, 200 and 300° C. Pulse/purge times for (Et$_3$Si)$_3$Sb and CH$_3$OH were 2.0/2.0 s and 1.0/2.0 s, respectively. No film was deposited on soda lime or native oxide SiO$_2$/Si substrates when 1000 cycles was applied in the F-120™ reactor. The process was also studied using an in situ ALD reactor equipped with a quartz crystal microbalance and a mass spectrometer. The results of these investigations indicated that ALD type of film growth using (Et$_3$Si)$_3$Sb+CH$_3$OH could not be achieved in the F-120™ reactor.

A deposition experiment using (Et$_3$Si)$_3$Sb+H$_2$O was conducted at 150° C. After 2000 deposition cycles no film growth took place on soda lime or native oxide SiO$_2$/Si. A similar experiment using (Et$_3$Si)$_2$Te+H$_2$O was also unsuccessful.

Although (Et$_3$Si)$_3$Sb may react with water and alcohols at normal pressure in large quantities, ALD process conditions are apparently not suitable for the growth to occur through these types of reactions. U.S. Patent Publication No. 2009-0191330 to Xiao discloses the synthesis of various silylantimony precursors. However, experiments only show reacting tris(trimethylsilyl)antimony with methanol in a flask. Our results show that under ALD process conditions in a flow type reactor no film is formed using $(Et_3Si)_3Sb$ and $CH_3OH$.

Precursors for ALD in Combination with Sb, as, Bi, and P Precursors Disclosed Herein The precursors used for ALD in combination with the Sb, As, Bi, and P precursors disclosed herein includes precursors that will react on the surface with the adsorbed Sb, As, Bi, and P precursors disclosed herein. A multi-component film, such as a Ge—Sb—Te film, may comprise multiple deposition cycles for different binary materials, such as in the case of GST, using Ge—Te cycles, Sb—Te cycles, and optionally Sb deposition cycles. Such multi-component materials may contain other precursors than precursors described herein, which are not favorable to use directly in the same cycle with the Sb, As, Bi, and P precursors disclosed herein, but are favorable to use in a multi-component material process in other cycles.

In some embodiments Sb, As, Bi, and P precursors disclosed herein are used in an ALD reaction with an other reactant that is not water, alcohol or ozone. In some embodiments the reactant used for ALD in combination with Sb, As, Bi, and P precursors disclosed herein is not an aminogermanium precursor, such as tetraaminogermanium or an organotellurium precursor. In some embodiments the other reactant to be used in combination with the Sb, As, Bi, and P precursors disclosed herein is not a chalcogenide precursor. In some embodiments the precursors used for ALD in combination with the Sb, As, Bi, and P precursors disclosed herein do not contain plasma. In some embodiments the precursors used for ALD in combination with the Sb, As, Bi, and P precursors disclosed herein do not contain nitrogen. In some embodiments the other reactant to be used in combination with the Sb, As, Bi, and P precursors disclosed herein is not an alkoxide substituted precursor. In some embodiments the other reactant to be used in combination with the Sb, As, Bi, and P precursors disclosed herein is not an amino substituted precursor. In some embodiments the other reactant to be used in combination with the Sb, As, Bi, and P precursors disclosed herein is not an alkyl substituted precursor. In some embodiments the precursors used for ALD in combination with the Sb, As, Bi, and P precursors disclosed herein are not reducing precursors, such as hydrogen, $H_2$/plasma, amine, imines, hydrazine, silane, silyl chalcogenide, germane, ammonia, alkane, alkene or alkyne. In some embodiments the Sb, As, Bi, and P precursors disclosed herein act as a reducing agent in an ALD process. In some embodiments the precursor used for ALD in combination with the Sb, As, Bi, and P precursors disclosed herein is an oxidizing precursor, such as $SbCl_3$. In some embodiments the oxidizing precursor does not contain oxygen. In preferred embodiments the oxidizing precursor is not alcohol, water, or ozone.

Any of the following metal precursors can be used in the various ALD processes disclosed herein.

In some embodiments the metal precursor is metal-organic or organometallic precursor. In some embodiments the metal precursor is a metal-organic or organometallic precursor, which does not contain nitrogen. In some embodiments the metal precursor is a halide precursor. In some embodiments the metal precursor is a halide precursor and does not contain any organic groups as ligands. In some embodiments the metal precursor contains only fluorides or chlorides, preferably chlorides, as ligands. In some embodiments the metal precursor is an adduct precursor. Adducts are not considered as a ligands and adducted precursor can have organic groups as adducts without having organic groups as ligands, for example, here it is considered that $GeCl_2$-dioxane does not have any organic groups as ligands. Ligands are groups or atoms which are directly bonded with the center atom.

In some embodiments, the reactants are selected such that a dehalosilylation reaction occurs between the reactants. In some embodiments a metal precursor is selected so that a dehalosilylation reaction occurs between the metal reactant and a Sb, As, Bi, or P precursor disclosed herein in an ALD processes. In some embodiments the metal precursor is selected so that a comproportionation reaction occurs between the metal reactant and a Sb, As, Bi, or P precursor disclosed herein in an ALD process.

Preferred precursors include, but are not limited to metal halides, alkyls, alkoxides, amides, silylamides, amidinates, cyclopentadienyls, carboxylates, betadiketonates and betadiketoimines Preferred metals in metal precursors include, but are not limited to Ga, Al, Ge, Bi, Zn, Cu, In, Ag, Au, Pb, Cd, Hg, Sn, Co, Ni, Si. In some cases the preferred metal can possibly be rare earth or alkaline rare earth metal.

More preferred Sb precursors include, any of the Sb precursors described herein and Sb halides, such as $SbCl_3$, $SbBr_3$ and $SbI_3$, Sb alkoxides, such as $Sb(OEt)_3$ and Sb amides.

More preferred Ge precursors include Ge halides, such as $GeCl_2$ and $GeBr_2$, adducted derivatives of $GeCl_2$, $GeF_2$ and $GeBr_2$, such as $GeCl_2$-dioxane. Preferably the oxidation state of Ge is +II.

More preferred Al precursors include Al halides, such as $AlCl_3$, and Al alkyls, such as trimethylaluminum (TMA).

More preferred Bi precursors include Bi halides, such as $BiCl_3$.

More preferred Ga precursors include Ga halides, such as $GaCl_3$, and Ga alkyls, such as trimethylgallium (TMG).

More preferred Zn precursors include elemental Zn, Zn halides, such as $ZnCl_2$, and alkyl zinc compounds such $Zn(Et)_2$ or $Zn(Me)_2$.

More preferred Cu compounds, include Cu carboxylates, such as Cu(II)-pivalate, Cu halide, such as CuCl or $CuCl_2$, Cu betadiketonates, such as $Cu(acac)_2$ or $Cu(thd)_2$ and Cu-amidinates.

More preferred In compounds, include In halides, such as $InCl_3$ and In alkyl compounds, such as $In(CH_3)_3$.

More preferred Pb compounds include Pb alkyls, such as tetraphenyl lead $Ph_4Pb$ or tetraethyl lead $Et_4Pb$.

More preferred Si precursors include Si halides, such as $SiCl_4$, and aminosilanes.

More preferred Sn precursors include Sn halides, such as $SnCl_4$.

More preferred Ni precursors include metalorganic Ni compounds, such as $Ni(acac)_2$ or $Ni(Cp)_2$.

More preferred Co precursors include metalorganic Co compounds, such as $Co(acac)_2$ or $Co(thd)_2$.

Precursors for ALD in Combination with N Precursors Disclosed Herein

Metal precursors can be used with the precursors comprising nitrogen that are disclosed herein to deposit thin films comprising nitrogen.

In some embodiments the metal precursor does not comprise a transition metal i.e. a metal selected from Groups 3 through 12 according to the IUPAC. In some embodiments the metal precursor does not comprise Si or Ge. In some embodiments the metal precursor comprises Al, B, Ga, In, Sn or Pb.

In some embodiments the metal precursor is a metal-organic or organometallic precursor. In some embodiments the metal precursor is a halide precursor. In some embodiments the metal precursor is a halide precursor and does not contain any organic groups as ligands. In some embodiments the metal precursor contains only fluorides or chlorides, preferably chlorides, as ligands. In some embodiments the metal precursor is an adduct precursor.

Preferred precursors include, but are not limited to metal halides, alkyls, alkoxides, amides, silylamides, amidinates, cyclopentadienyls, carboxylates, betadiketonates and betadiketoimines, wherein the metal is not a transition metal.

More preferred Al precursors include Al halides, such as $AlCl_3$, and Al alkyls, such as trimethylaluminum (TMA).

More preferred Ga precursors include Ga halides, such as $GaCl_3$, and Ga alkyls, such as trimethylgallium (TMG).

More preferred In compounds, include In halides, such as $InCl_3$ and In alkyl compounds, such as $In(CH_3)_3$.

More preferred Pb compounds include Pb alkyls, such as tetraphenyl lead $Ph_4Pb$ or tetraethyl lead $Et_4Pb$.

More preferred Sn precursors include Sn halides, such as $SnCl_4$.

Te and Se Precursors for Atomic Layer Deposition

Te and Se precursors are disclosed in U.S. application Ser. No. 12/429,133 filed Apr. 23, 2009 entitled "Synthesis and Use of Precursors for ALD of Tellurium and Selenium Thin Films" The disclosure of which is incorporated by reference herein in its entirety.

Any of the following precursors can be used in the various ALD processes disclosed herein. In particular, precursors comprising Te and Se are disclosed.

In some embodiments the Te or Se precursor has Te or Se bound to two silicon atoms. For example it can have a general formula of $A(SiR^1R^2R^3)_2$, wherein A is Te or Se and $R^1$, $R^2$, and $R^3$ are alkyl groups comprising one or more carbon atoms. The $R^1$, $R^2$, and $R^3$ alkyl groups can be selected independently of each other in each ligand based on the desired physical properties of the precursor such as volatility, vapor pressure, toxicity, etc. In some embodiments, $R^1$, $R^2$ and/or $R^3$ can be hydrogen, alkenyl, alkynyl or aryl groups. In some embodiments, $R^1$, $R^2$, $R^3$ can be any organic groups containing heteroatoms, such as N, O, F, Si, P, S, Cl, Br or I. In some embodiments $R^1$, $R^2$, $R^3$ can be halogen atoms. In some embodiments the Te precursor is $Te(SiMe_2{}^tBu)_2$ and the Se precursor is $Se(SiMe_2{}^tBu)_2$. In other embodiments the precursor is $Te(SiEt_3)_2$, $Te(SiMe_3)_2$, $Se(SiEt_3)_2$ or $Se(SiMe_3)_2$. In more preferred embodiments the precursor has a Te—Si or Se—Si bond and most preferably Si—Te—Si or Si—Se—Si bond structure.

In some embodiments the Te or Se precursor has a general formula of $[R^1R^2R^3X^1]_3$—Si-A-Si—$[X^2R^4R^5R^6]_3$, wherein A is Te or Se; and wherein $R^1$, $R^2$, $R^3$, $R^4$, $R^5$ and $R^6$, can be independently selected to be alkyl, hydrogen, alkenyl, alkynyl or aryl groups. In some embodiments, $R^1$, $R^2$, $R^3$, $R^4$, $R^5$ and $R^6$ can be any organic groups containing also heteroatoms, such as N, O, F, Si, P, S, Cl, Br or I. In some embodiments $R^1$, $R^2$, $R^3$, $R^4$, $R^5$ and $R^6$ can be halogen atoms. In some embodiments $X^1$ and $X^2$ can be Si, N, or O. In some embodiments $X^1$ and $X^2$ are different elements. In embodiments when X is Si then Si will be bound to three R groups, for example $[R^1R^2R^3Si]_3$—Si-A-Si—$[SiR^4R^5R^6]_3$. In embodiments when X is N then nitrogen will only be bound to two R groups ($[R^1R^2N]_3$—Si-A-Si—$[NR^3R^4]_3$). In embodiments when X is O, the oxygen will only be bound to one R group, for example $[R^1—O]_3$—Si-A-Si—$[O—R^2]_3$. $R^1$, $R^2$, $R^3$, $R^4$, $R^5$ and $R^6$ groups can be selected independently of each other in each ligand based on the desired physical properties of the precursor such as volatility, vapor pressure, toxicity, etc In some embodiments the Te or Se precursor is selected from the group consisting of: $R^1R^2R^3Si$—Si-A-Si—$SiR^4R^5R^6$; $R^1R^2N$—Si-A-Si—$NR^3R^4$; $R^1$—O—Si-A-Si—O—$R^2$; or $R^1R^2Si$-A-$SiR^3R^4$ with a double bond between silicon and one of the R groups. In other embodiments the Te or Se precursor comprises: a ring or cyclical configuration comprising a Te or Se atom and multiple Si atoms; or comprises more than one Te atoms or more than one Se atoms. In these embodiments A is Te or Se and $R^1$, $R^2$, $R^3$, $R^4$, $R^5$ and $R^6$, are selected from the group consisting of alkyl, hydrogen, alkenyl, alkynyl, or aryl groups. In some embodiments the Te or Se precursor is not $A(SiR^1R^2R^3)_2$.

In some embodiments the Te or Se precursor has a formula similar to the formulas described above, however the Si atom has a double bond to one of the R groups in the ligand (e.g. A-Si=) wherein A is Te or Se. For example, a partial structure of the precursor formula is represented below:

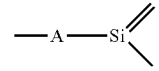

In some embodiments the precursor contains multiple atoms of Si and Te or Se. For example, a partial structure of a precursor in one embodiment is represented below wherein A is Te or Se:

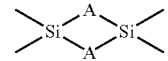

The Si atoms in the partial formula pictured above can also be bound to one or more R groups. In some embodiments, any of the R groups described herein can be used.

In some embodiments the precursor contains a Si—Te—Si or Si—Se—Si bond structure in a cyclical or ring structure. For example, a partial structure of a precursor in one embodiment is represented below, wherein A is Te or Se.

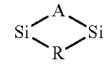

The R group can comprise an alkyl, alkenyl, alkynyl, alkylsilyl, alkylamine or alkoxide group. In some embodiments the R group is substituted or branched. In some embodiments the R group is not substituted and/or is not branched. The Si atoms in the partial formula pictured above can also be bound to one or more R groups. In some embodiments, any of the R groups described herein can be used.

Atomic Layer Deposition of Sb—Te

Methods for forming Sb—Te thin films using Te precursors are disclosed in U.S. application Ser. No. 12/429,133 filed Apr. 23, 2009 entitled "Synthesis and Use of Precursors for ALD of Tellurium and Selenium Thin Films" The disclosure of which is incorporated by reference herein in its entirety.

In some embodiments, Sb—Te, preferably $Sb_2Te_3$, films are deposited by ALD preferably without the use of plasma, however in some cases plasma might be used, if needed. For example, if elemental Te films or Te-rich films are desired plasma, such as hydrogen plasma, hydrogen radicals or atomic hydrogen, may be used. Another use for plasma is doping of the films, for example doping by 0, N or Si may be done using plasma.

According to some embodiments, an $Sb_2Te_3$ thin film is formed on a substrate in a reaction chamber by an ALD type process comprising multiple Sb—Te deposition cycles, each deposition cycle comprising:

providing a first vapor phase reactant pulse comprising a Sb precursor into the reaction chamber to form no more than about a single molecular layer of the Sb precursor on the substrate;

removing excess first reactant from the reaction chamber;

providing a second vapor phase reactant pulse comprising an Te precursor to the reaction chamber such that the Te precursor reacts with the Sb precursor on the substrate to form $Sb_2Te_3$; and removing excess second reactant and reaction byproducts, if any, from the reaction chamber.

This can be referred to as the Sb—Te deposition cycle. Each Sb—Te deposition cycle typically forms at most about one monolayer of $Sb_2Te_3$. In some embodiments, the Sb—Te deposition cycle is repeated until a film of a desired thickness is formed.

Although the illustrated Sb—Te deposition cycle begins with provision of the Sb precursor, in other embodiments the deposition cycle begins with the provision of the Te precursor.

In some embodiments, the reactants and reaction byproducts can be removed from the reaction chamber by stopping the flow of Te or Sb precursor while continuing the flow of an inert carrier gas such as nitrogen or argon.

In some embodiments the Sb source is $SbX_3$, wherein X is a halogen element. More preferably the Sb source is $SbCl_3$ or $SbI_3$.

Preferably, the Te precursor has a formula of $Te(SiR^1R^2R^3)_2$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc. In some embodiments the Te precursor is $Te(SiMe_2Bu)_2$. In other embodiments the precursor is $Te(SiEt_3)_2$ or $Te(SiMe_3)_2$. In some embodiments the Te precursor is $Te(SiEt_3)_2$ and the Sb precursor is $SbCl_3$.

In some embodiments, one or more dopants selected from the group consisting of O, N, C, Si, Sn, Ag, Al, Ga, P, Fe, Ge, In, Ag, Se, Te or Bi, but not limited to those, is introduced into film. The precursor comprising dopant reacts preferably, but not necessarily, with the Te precursors described herein.

The particular process conditions can be selected by the skilled artisan based on the properties of the selected precursors and desired properties of the deposited film.

Atomic Layer Deposition of Sb—Te Using Sb and Sb—Te Cycles

In some embodiments, $Sb_xTe_y$ films having a desired composition can be deposited using Sb and Sb—Te cycles.

The ratio of Sb—Te to the total number of cycles, e.g. number of Sb cycles and Sb—Te cycles, can be varied such that a $Sb_xTe_y$ film is deposited with a desired composition. The variables x and y can be expressed as atomic ratios, atomic percentage, or the atomic composition per molecule. The units of expression of x and y should be apparent to the skilled artisan.

In some embodiments, the ratio of Sb cycles to Sb—Te cycles is between about 1:100 and 100:1. Preferably, the ratio of Sb—Te cycles to Sb and Sb—Te cycles is selected to deposit an $Sb_xTe_y$ thin film having a desired composition. In some embodiments, $Sb_2Te_3$ is deposited.

In some embodiments, x is preferably between about 30% and about 50%. In some embodiments, x preferably is between about 35% and 45%.

In some embodiments, y is preferably between about 50% and 70%. In some embodiments, y is preferably between about 55% and 65%.

In some embodiments x is preferably about 2. In some embodiments, y is between 0 and about 3. In some embodiments, x is 2 and y is 1. In some embodiments the Sb film is doped with Te and therefore the y is from about 1% to about 10% and x is from about 99% to 90%, respectively, In some embodiments, the Sb—Te thin film is crystalline as deposited. In some embodiments, the Sb—Te thin film can be amorphous as deposited. In some embodiments, the thin film can be annealed to convert an amorphous thin film to a crystalline thin film.

In some embodiments, any of the process conditions described herein can be used. For example, the reactants, reactant flow rates and concentrations, temperature, etc. described herein can be used for the Sb or Sb—Te deposition cycles.

In some embodiments, one or more dopants selected from the group consisting of O, N, C, Si, Sn, Ag, Al, Ga, P, Fe, Ge, In, Ag, Se, Te or Bi, but not limited to those, is introduced into Sb—Te film. In some embodiments, the Sb—Te film is doped with Ag and In and have a composition of approximately $Ag_{0.055}In_{0.065}Sb_{0.59}Te_{0.29}$.

Example 2

$Sb_xTe_y$ films were grown using Sb deposition cycles and $Sb_2Te_3$ deposition cycles. The substrate temperature was about 95° C. during the deposition cycles. $Sb_2Te_3$ was deposited with $SbCl_3$ and $Te(SiEt_3)_2$ using a deposition cycle comprising:

a 1 second $SbCl_3$ pulse;
a 2 second purge;
a 1 second $Te(SiEt_3)_2$ pulse; and
a 2 second purge.

Sb was deposited by a Sb deposition cycle with $SbCl_3$ and $Sb(SiEt_3)_3$ comprising:

a 1 second $SbCl_3$ pulse;
a 2 second purge;
a 2 second $Sb(SiEt_3)_3$ pulse; and
a 2 second purge.

Films of different compositions were deposited while varying the ratio of Sb to $Sb_2Te_3$. The data is illustrated in FIGS. 5-7.

Figure 5:
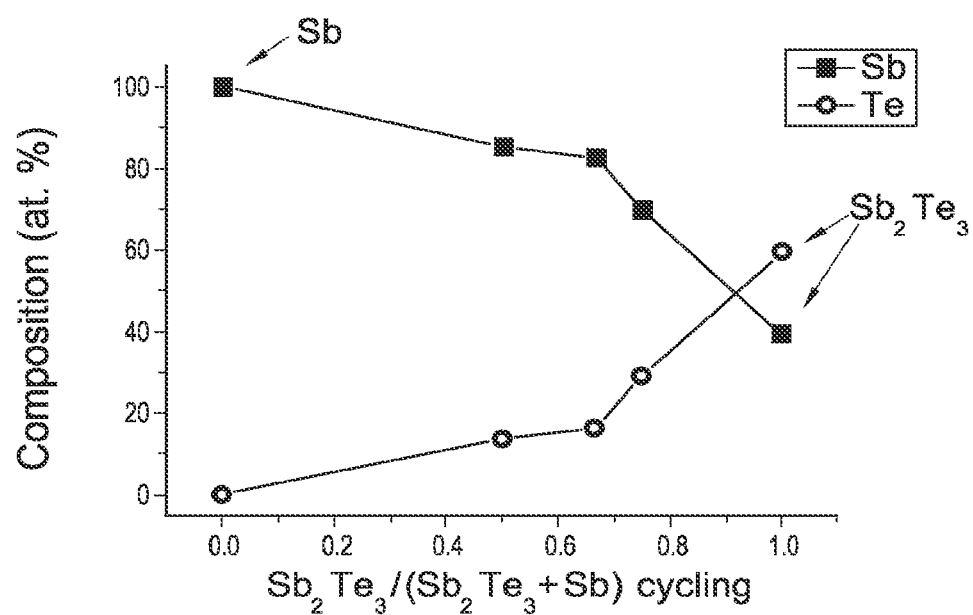
FIG. 5 is a graph of the composition of a Sb—Te film as measured by energy dispersive x-ray (EDX) analysis.

FIG. 5 shows the composition of the deposited films versus the ratio of $Sb_2Te_3$ cycles to the total number of Sb and $Sb_2Te_3$ cycles. The composition of pure Sb and $Sb_2Te_3$ are indicated for reference on FIG. 5. FIG. 5 shows two linear regions with different slopes. The first region has a first slope for ratios from 0 to about 0.66. The slope changes for the second linear region for cycle ratios from about 0.66 to 1. The data in FIG. 5 indicates that the composition of the deposited Sb—Te film can be tailored based on the ratio of Sb cycles to $Sb_2Te_3$ cycles.

Figure 6:
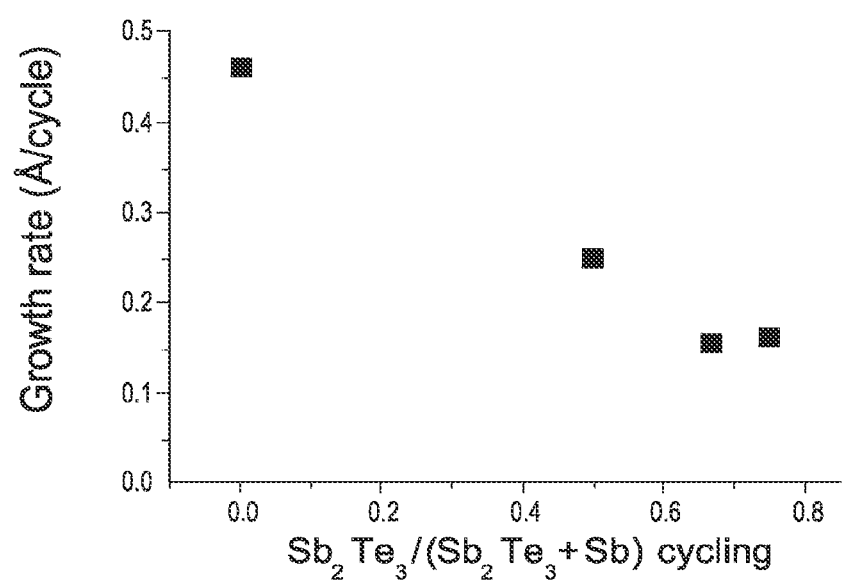
FIG. 6 is a graph of the average growth rate per cycle for Sb—Te thin films versus the cycling ratio between Sb—Te and Sb cycles.
Figure 7:
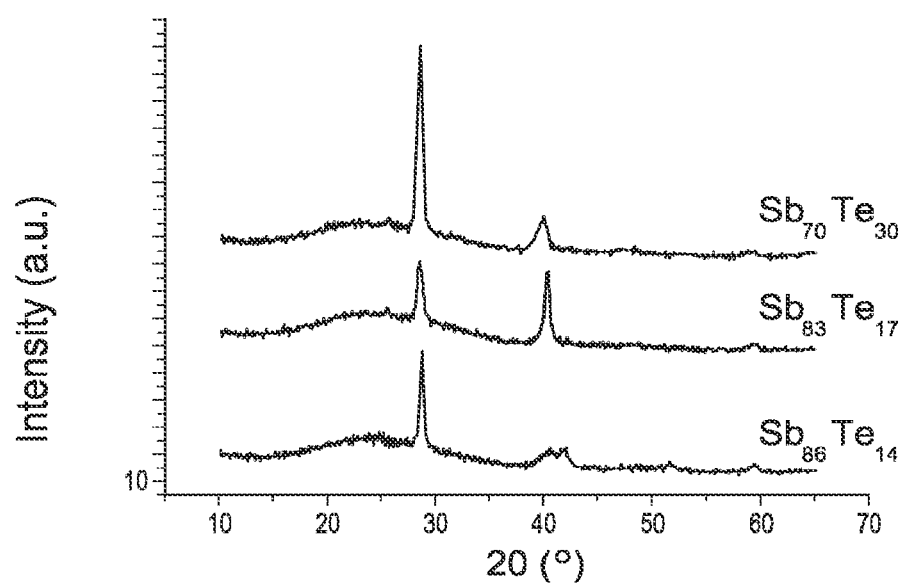
FIG. 7 is a gracing incidence x-ray diffractogram of Sb—Te thin films of various compositions.

FIG. 6 illustrates the average growth rate per cycle versus the ratio of $Sb_2Te_3$ cycles to the total number of Sb and $Sb_2Te_3$ cycles. The average growth rate for the Sb deposition cycle is about 0.45 Å/cycle. The average growth rate for a $Sb_2Te_3$ deposition cycle is about 0.15 Å/cycle. FIG. 6 illustrates that the average growth rate per cycle approaches the $Sb_2Te_3$ growth rate per cycle for a cycle ratio of about 0.66.

The crystallinity was also measured by GIXRD. FIG. 7 illustrates GIXRD data for Sb—Te films of varying compositions, including $Sb_{70}Te_{30}$, $Sb_{83}Te_{17}$, and $Sb_{86}Te_{14}$. All three films illustrated in FIG. 7 were crystalline. No chlorine was detected by EDX measurements of the deposited films.

Atomic Layer Deposition of Ge—Sb

Figure 2:
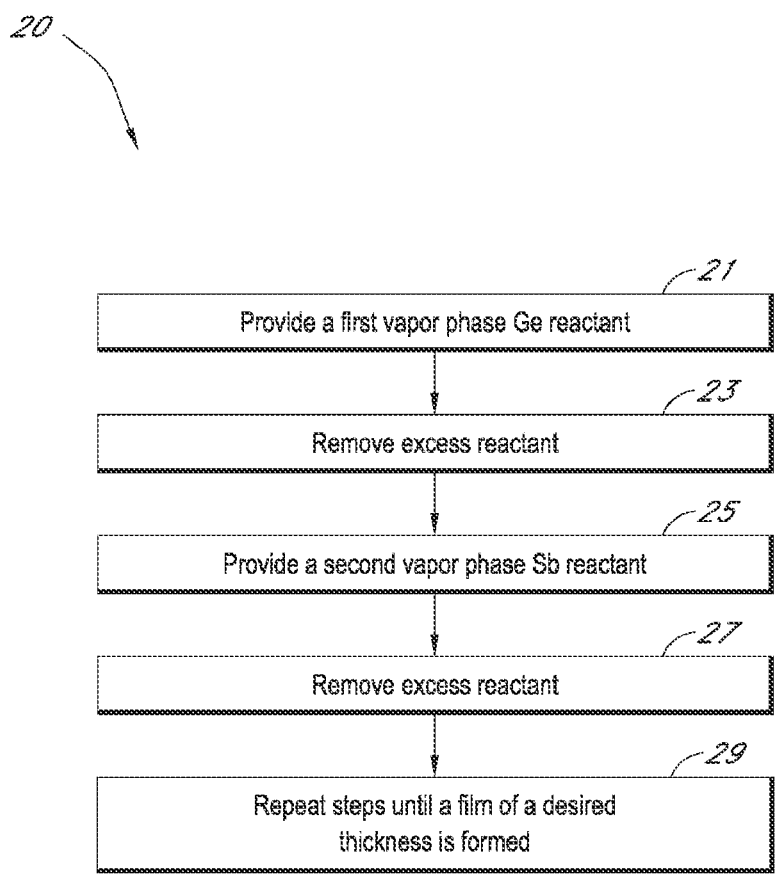
FIG. 2 a flow chart generally illustrating a method for forming a Ge—Sb film in accordance with one embodiment.

In some embodiments, a $Ge_xSb_y$ thin film is formed by ALD without the use of plasma. FIG. 2 is a flow chart generally illustrating a method for forming a Ge—Sb thin film 20 in accordance with one embodiment. A Ge—Sb thin film is formed on a substrate by an ALD type process comprising multiple Ge—Sb deposition cycles, each deposition cycle comprising:

providing a first vapor phase reactant pulse comprising a Ge precursor 21 into the reaction chamber to form no more than about a single molecular layer of the Ge precursor on the substrate;

removing excess first reactant from the reaction chamber 23;

providing a second vapor phase reactant pulse comprising a Sb precursor 25 to the reaction chamber such that the Sb precursor reacts with the Ge precursor on the substrate; and removing excess second reactant and reaction byproducts, if any, from the reaction chamber 27.

This can be referred to as the Ge—Sb deposition cycle. Each Ge—Sb deposition cycle typically forms at most about one monolayer of Ge—Sb. The Ge—Sb deposition cycle is repeated until a film of a desired thickness is formed 29. In some embodiments a Ge—Sb film of from about 10 Å to about 2000 Å is formed.

The x and y values and composition of the $Ge_xSb_y$ film can vary. In some embodiments, x and y are less than 1. In some embodiments, the sum of x and y is equal to about 1, or 100 if the x and y values are expressed as a percentage.

Although the illustrated Ge—Sb deposition cycle begins with provision of the Ge precursor, in other embodiments the deposition cycle begins with the provision of the Sb precursor.

In some embodiments, the reactants and reaction byproducts can be removed from the reaction chamber by stopping the flow of Ge or Sb precursor while continuing the flow of an inert carrier gas such as nitrogen or argon.

Preferably, the Ge source is $GeX_2$ or $GeX_4$, wherein X is a halogen element. Preferably the oxidation state of Ge is +II. In some embodiments the Ge source is $GeBr_2$. In some embodiments the Ge source is germanium halide with coordinating ligands, such as dioxane ligands. Preferably the Ge source with coordinating ligands is germanium dihalide complex, more preferably a germanium dichloride dioxane complex $GeCl_2 \cdot C_4H_8O_2$.

The Sb precursor can be any of the Sb precursors described herein. Preferably, the second Sb precursor has a formula of $Sb(SiR^1R^2R^3)_2$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc.

The substrate temperature during forming the Ge—Sb thin film is preferably less than 250° C. and more preferably less than 200° C. and even more preferably below 100° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Ge—Sb thin film.

Preferably the Ge and Sb reactants are pulsed for about 0.05 to 10 seconds, more preferably about 0.2 to 4 seconds, and most preferably about 1 to 4 seconds. The purge steps in which excess reactant and reaction by-products, if any, are removed are preferably about 0.05 to 10 seconds, more preferably about 0.2-4 seconds, In some cases like in batch ALD reactors the pulse and purge times can vary much more and longer pulse times may be used even in order of minutes.

In some embodiments the deposited Ge—Sb thin films are amorphous. In some embodiments, the deposited Ge—Sb thin films are crystalline.

In some embodiments, the deposited Ge—Sb film can be annealed.

In some embodiments, one or more dopants selected from the group consisting of O, N, C, Si, Sn, Ag, Al, Ga, P, Fe, Ge, In, Ag, Se, Te or Bi, but not limited to those, is introduced into Ge—Sb film.

Example 3

Ge—Sb films were deposited on substrates at approximately 95° C. using $Sb(SiEt_3)_3$ as the Sb source and $GeCl_2 \cdot C_4H_8O_2$ as the Ge source, using a deposition cycle comprising:

a 4 second $GeCl_2 \cdot C_4H_8O_2$ pulse;

a 6 second purge;

a 2 second $Sb(SiEt_3)_3$ pulse; and a 2 second purge.

The growth rate per cycle was calculated at about 0.23 Å/cycle. X-ray diffractogram results indicated that the deposited film was amorphous. Energy dispersive x-ray (EDX) analysis showed that the deposited film was $Ge_{0.82}Sb_{0.18}$ (82 at % Ge and 18 at % Sb).

Atomic Layer Deposition of Ge—Sb Using Sb and Ge—Sb Deposition Cycles

In some embodiments, $Ge_xSb_y$ films having a desired composition can be deposited using Sb and Ge—Sb cycles.

The ratio of Ge—Sb to the total number of cycles, e.g. number of Sb cycles and Ge—Sb cycles, can be varied such that a $Ge_xSb_y$ film is deposited with a desired composition. The variables x and y can be expressed as atomic ratios, atomic percentage, or the atomic composition per molecule. The units of expression of x and y should be apparent to the skilled artisan.

In some embodiments, the ratio of Sb to Ge—Sb cycles is between about 1:100 and 100:1. Preferably, the ratio of Sb to Sb and Ge—Sb is selected to deposit a Ge—Sb thin film having a desired composition.

In some embodiments, x is preferably between about 5% and about 20%. In some embodiments, y is preferably between about 80% and 95%. In one embodiment, a film with eutectic composition, $Ge_{15}Sb_{85}$, is deposited. In some embodiments the Sb film is doped with Ge and therefore the y is from about 1% to about 10% and x is from about 99% to 90%, respectively.

In some embodiments, the Ge—Sb thin film is crystalline as deposited. In some embodiments, the Ge—Sb thin film can be amorphous as deposited. In some embodiments, the thin film can be annealed to convert an amorphous thin film to a crystalline thin film.

In some embodiments, any of the process conditions described herein can be used. For example, the reactants, reactant flow rates and concentrations, temperature, etc. described herein can be used for the Sb or Ge—Sb deposition cycles.

In some embodiments, one or more dopants selected from the group consisting of O, N, C, Si, Sn, Ag, Al, Ga, P, Fe, Ge, In, Ag, Se, Te or Bi, but not limited to those, is introduced into film.

Example 4

Ge—Sb films of varying compositions were deposited using Sb deposition cycles and Ge—Sb deposition cycles. The Sb was deposited by a Sb deposition cycle using $SbCl_3$ and $Sb(SiEt_3)_3$ comprising:
- a 1 second $SbCl_3$ pulse;
- a 2 second purge;
- 2 second $Sb(SiEt_3)_3$ pulse; and
- a 2 second purge.

The Ge—Sb films were deposited using $Sb(SiEt_3)_3$ as the Sb source and $GeCl_2$—$C_4H_8O_2$ as the Ge source, using a deposition cycle comprising:
- a 4 second GeCl2.C4H8O2 pulse;
- a 6 second purge;
- a 2 second Sb(SiEt3)3 pulse; and
- a 2 second purge.

Figure 8:
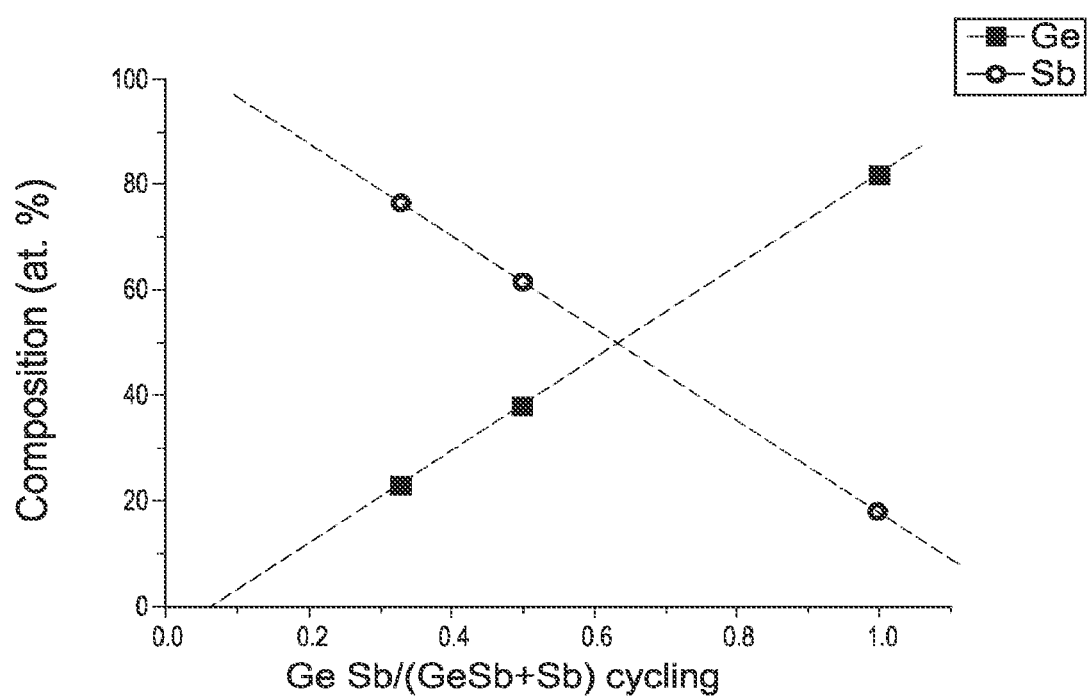
FIG. 8 is a graph of the composition of various Ge—Sb films for various Ge—Sb to Sb cycling ratios as measured by EDX analysis.
Figure 9:
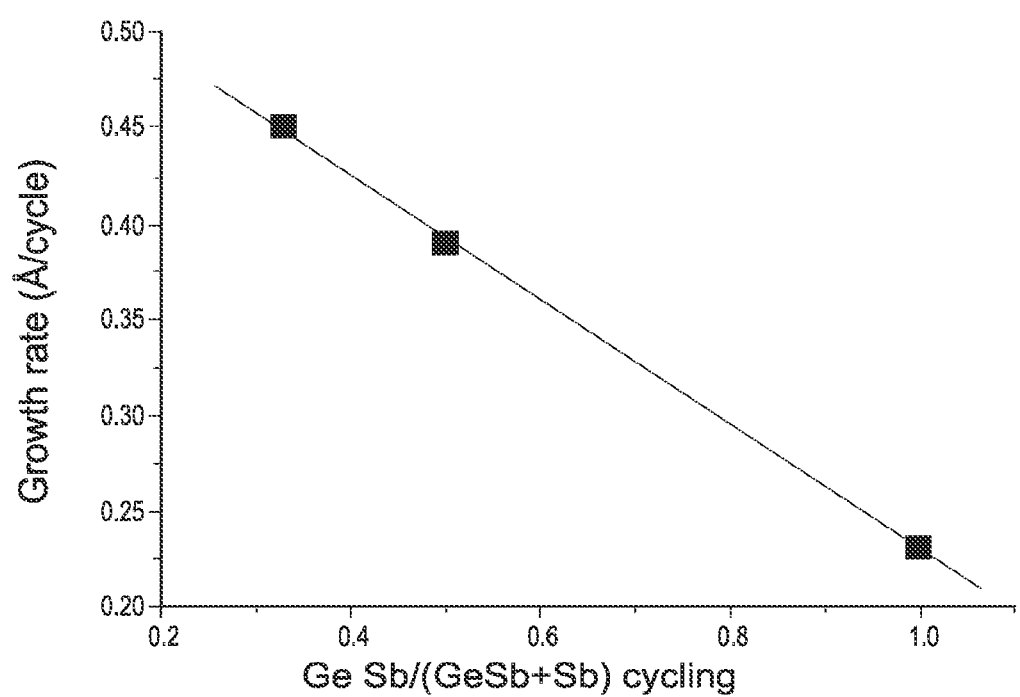
FIG. 9 is a graph of the average growth rate per cycle for Ge—Sb thin films versus the cycling ratio between Ge—Sb and Sb cycling ratio.

FIGS. 8 and 9 illustrate composition and growth rate for the deposited Ge—Sb films versus the ratio of Ge—Sb cycles to the total number of cycles.

FIG. 8 illustrates a linear relationship between the ratios of Ge—Sb cycles to total number of cycles versus composition of the deposited film. FIG. 9 also illustrates a linear relationship between the average growth rate per cycle and the ratio of Ge—Sb cycles to total cycles.

The $Ge_{0.23}Sb_{0.77}$ and $Ge_{0.82}Sb_{0.18}$ films were characterized by EDX analysis. The $Ge_{0.23}Sb_{0.77}$ and $Ge_{0.82}Sb_{0.18}$ films were amorphous as deposited. EDX analysis also found that some chlorine was present in the deposited Ge—Sb films. The amount of chlorine increased with the amount of Ge present in the deposited film. It is likely that the chlorine comes from the $GeCl_2$—$C_4H_8O_2$ precursor. For PCM applications with Ge—Sb films with relatively low Ge content (e.g. $Ge_{0.15}Sb_{0.85}$), the chlorine contribution from the $GeCl_2$—$C_4H_8O_2$ precursor may not adversely affect device performance Atomic Layer Deposition of Ge—Sb—Te Using Sb, Sb—Te, Ge—Te and Ge—Sb Deposition Cycles According to some embodiments, $Ge_xSb_yTe_z$ (GST) thin films are formed on a substrate by an ALD type process comprising multiple deposition cycles.

In some embodiments Sb, Te and Ge deposition cycles are provided to deposit a GST thin film with a desired stoichiometry and desired thickness. The particular ratio and order of cycles can be selected to achieve a thin film having a desired composition In some embodiments Sb, Sb—Te, Ge—Te deposition cycles are provided to deposit a GST thin film with a desired stoichiometry and desired thickness. The particular ratio and order of cycles can be selected to achieve the desired composition.

In some embodiments Sb, Sb—Te, Ge—Te and Ge—Sb deposition cycles are provided to deposit a GST thin film with a desired stoichiometry and desired thickness. The particular ratio and order of cycles can be selected to achieve the desired composition.

In some embodiments a GST thin film having the formula $Ge_2Sb_2Te_5$ is deposited. In some embodiments, an Sb rich GST film, such as $Ge_3Sb_6Te_5$, is deposited. In some embodiments a thin film having the formula $GeSb_2Te_4$ is deposited. In some embodiments a thin film having the formula $GeSb_4Te_7$ is deposited.

The skilled artisan will appreciate that the Sb, Sb—Te, Ge—Te and Ge—Sb deposition cycles can be performed in any order. In some embodiments the GST deposition process begins with a Sb deposition cycle and in other embodiments the GST deposition process begins with an Sb—Te deposition cycle, Ge—Te or Ge—Sb cycle.

The skilled artisan will also appreciate that multiple Sb deposition cycles can be performed consecutively prior to a Sb—Te or Ge—Sb cycle, multiple Sb—Te deposition cycles can be performed consecutively prior to a subsequent Sb or Ge—Sb deposition cycle, and multiple Ge—Sb deposition cycles can be performed consecutively prior to a subsequent Sb, Ge—Te or Sb—Te deposition cycle.

In some embodiments, any of the process conditions described herein can be used. For example, the reactants, reactant flow rates and concentrations, temperature, etc. described herein can be used for the Sb, Ge—Sb, Sb—Te, Ge—Te deposition cycles.

In some embodiments the GST thin film can be crystalline as deposited. In other embodiments an amorphous GST thin film is deposited. In some embodiments, the amorphous thin film can be annealed in the presence of an inert gas, such as nitrogen. The substrate and thin film can also be heated during the annealing step at a temperature above the deposition temperature. Preferably, the substrate temperature during the annealing step is above about 130° C. More preferably, the substrate temperature during the annealing step is above about 250° C. Most preferably the temperature during the annealing step is above 300° C. The annealing step can change the crystallinity of the thin film. In some embodiments an amorphous thin film can crystallize during the annealing step. In some embodiments the crystallinity of a crystalline GST thin film can change during the annealing step.

Atomic Layer Deposition of Ge—Sb—Se Using Sb, Sb—Se, Ge—Se and Ge—Sb Deposition Cycles According to some embodiments, $Ge_xSb_ySe_z$ thin films are formed on a substrate by an ALD type process comprising multiple deposition cycles.

In some embodiments Sb, Sb—Se, Ge—Se and Ge—Sb deposition cycles are provided to deposit a thin film with a desired stoichiometry and desired thickness. The particular ratio and order of cycles can be selected to achieve the desired composition.

The skilled artisan will appreciate that the Sb, Sb—Se, Ge—Se and Ge—Sb deposition cycles can be performed in any order. In some embodiments the deposition process begins with a Sb deposition cycle and in other embodiments the deposition process begins with an Sb—Se deposition cycle, Ge—Se or Ge—Sb cycle.

The skilled artisan will also appreciate that multiple Sb deposition cycles can be performed consecutively prior to a Sb—Se or Ge—Sb cycle, multiple Sb—Se deposition cycles can be performed consecutively prior to a subsequent Sb or Ge—Sb deposition cycle, and multiple Ge—Sb deposition cycles can be performed consecutively prior to a subsequent Sb, Ge—Se or Sb—Se deposition cycle.

In some embodiments, any of the process conditions described herein can be used. For example, the reactants, reactant flow rates and concentrations, temperature, etc. described herein can be used for the Sb, Ge—Sb, Sb—Se, and Ge—Se deposition cycles.

In some embodiments the thin film can be crystalline as deposited. In other embodiments an amorphous thin film is deposited. In some embodiments, the amorphous thin film can be annealed in the presence of an inert gas, such as nitrogen. The substrate and thin film can also be heated during the annealing step at a temperature above the deposition temperature. Preferably, the substrate temperature during the annealing step is above about 130° C. More preferably, the substrate temperature during the annealing step is above about 250° C. Most preferably the temperature during the annealing step is above 300° C. The annealing step can change the crystallinity of the thin film. In some embodiments an amorphous thin film can crystallize during the annealing step. In some embodiments the crystallinity of a crystalline thin film can change during the annealing step.

Atomic layer deposition of Al—Sb

In some embodiments, a Al $Sb_y$ thin film is formed by ALD without the use of plasma. An Al—Sb thin film is formed on a substrate by an ALD type process comprising multiple Al—Sb deposition cycles, each deposition cycle comprising:

providing a first vapor phase reactant pulse comprising a Al precursor into the reaction chamber to form no more than about a single molecular layer of the Al precursor on the substrate;

removing excess first reactant from the reaction chamber;

providing a second vapor phase reactant pulse comprising a Sb precursor to the reaction chamber such that the Sb precursor reacts with the Al precursor on the substrate; and removing excess second reactant and reaction byproducts, if any, from the reaction chamber.

This can be referred to as the Al—Sb deposition cycle. Each Al—Sb deposition cycle typically forms at most about one monolayer of Al—Sb. The Al—Sb deposition cycle is repeated until a film of a desired thickness is formed. In some embodiments a Al—Sb film of from about 10 Å to about 2000 Å is formed.

The x and y values and composition of the $Al_xSb_y$ film can vary. In some embodiments, x and y are less than 1. In some embodiments, the sum of x and y is equal to about 1, or 100 if the x and y values are expressed as a percentage.

Although the illustrated Al—Sb deposition cycle begins with provision of the Al precursor, in other embodiments the deposition cycle begins with the provision of the Sb precursor.

In some embodiments, the reactants and reaction by-products can be removed from the reaction chamber by stopping the flow of Al or Sb precursor while continuing the flow of an inert carrier gas such as nitrogen or argon.

Preferably, the Al source is $AlX_3$, wherein X is a halogen element. In some embodiments the Al source is $AlCl_3$. In some embodiments Al source is aluminum alkyl compound, such as trimethylaluminum (TMA).

The Sb precursor can be any of the Sb precursors described herein.

Preferably, the second Sb precursor has a formula of $Sb(SiR^1R^2R^3)_3$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc.

The substrate temperature during forming the Al—Sb thin film is preferably less than 500° C. and more preferably less than 350° C. and even more preferably below 200° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Al—Sb thin film.

Preferably the Al and Sb reactants are pulsed for about 0.05 to 10 seconds, more preferably about 0.2 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes In some embodiments the deposited Al—Sb thin films are amorphous. In some embodiments, the deposited Al—Sb thin films are crystalline.

In some embodiments, the deposited Al—Sb film can be annealed.

Atomic Layer Deposition of in-Sb

In some embodiments, a $In_xSb_y$ thin film is formed by ALD without the use of plasma. An In—Sb thin film is formed on a substrate by an ALD type process comprising multiple In—Sb deposition cycles, each deposition cycle comprising:

providing a first vapor phase reactant pulse comprising a In precursor into the reaction chamber to form no more than about a single molecular layer of the In precursor on the substrate;

removing excess first reactant from the reaction chamber;

providing a second vapor phase reactant pulse comprising a Sb precursor to the reaction chamber such that the Sb precursor reacts with the In precursor on the substrate; and removing excess second reactant and reaction byproducts, if any, from the reaction chamber.

This can be referred to as the In—Sb deposition cycle. Each In—Sb deposition cycle typically forms at most about one monolayer of In—Sb. The In—Sb deposition cycle is repeated until a film of a desired thickness is formed. In some embodiments a In—Sb film of from about 10 Å to about 2000 Å is formed.

The x and y values and composition of the $In_xSb_y$ film can vary. In some embodiments, x and y are less than 1. In some embodiments, the sum of x and y is equal to about 1, or 100 if the x and y values are expressed as a percentage.

Although the illustrated In—Sb deposition cycle begins with provision of the In precursor, in other embodiments the deposition cycle begins with the provision of the Sb precursor.

In some embodiments, the reactants and reaction by-products can be removed from the reaction chamber by stopping the flow of In or Sb precursor while continuing the flow of an inert carrier gas such as nitrogen or argon.

Preferably, the In source is $InX_3$, wherein X is a halogen element. In some embodiments the In source is $InCl_3$. In some embodiments In source is indium alkyl compound, such as trimethylindium (TMI). In some embodiments the In source is an indium betadiketonate, such as indium acetylacetonate In(acac)$_3$. In some embodiment the In source is InCp or a substituted Cp-derivative thereof.

The Sb precursor can be any of the Sb precursors described herein. Preferably, the second Sb precursor has a formula of Sb(SiR$^1$R$^2$R$^3$)$_3$, wherein R$^1$, R$^2$, and R$^3$ are alkyl groups comprising one or more carbon atoms. The R$^1$, R$^2$, and R$^3$ alkyl groups can be selected based on the desired physical properties of the precursor such as volatility, vapor pressure, toxicity, etc.

The substrate temperature during forming the In—Sb thin film is preferably less than 500° C. and more preferably less than 350° C. and even more preferably below 200° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited In—Sb thin film.

Preferably the In and Sb reactants are pulsed for about 0.05 to 10 seconds, more preferably about 0.2 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes.

In some embodiments the deposited In—Sb thin films are amorphous. In some embodiments, the deposited In—Sb thin films are crystalline.

In some embodiments, the deposited In—Sb film can be annealed.

Atomic Layer Deposition of Ga—Sb

In some embodiments, a Ga$_x$Sb$_y$ thin film is formed by ALD without the use of plasma. An Ga—Sb thin film is formed on a substrate by an ALD type process comprising multiple Ga—Sb deposition cycles, each deposition cycle comprising:

providing a first vapor phase reactant pulse comprising a Ga precursor into the reaction chamber to form no more than about a single molecular layer of the Ga precursor on the substrate;

removing excess first reactant from the reaction chamber;

providing a second vapor phase reactant pulse comprising a Sb precursor to the reaction chamber such that the Sb precursor reacts with the Ga precursor on the substrate; and removing excess second reactant and reaction byproducts, if any, from the reaction chamber.

This can be referred to as the Ga—Sb deposition cycle. Each Ga—Sb deposition cycle typically forms at most about one monolayer of Ga—Sb. The Ga—Sb deposition cycle is repeated until a film of a desired thickness is formed. In some embodiments a Ga—Sb film of from about 10 Å to about 2000 Å is formed.

The x and y values and composition of the Ga$_x$Sb$_y$ film can vary. In some embodiments, x and y are less than 1. In some embodiments, the sum of x and y is equal to about 1, or 100 if the x and y values are expressed as a percentage.

Although the illustrated Ga—Sb deposition cycle begins with provision of the Ga precursor, in other embodiments the deposition cycle begins with the provision of the Sb precursor.

In some embodiments, the reactants and reaction by-products can be removed from the reaction chamber by stopping the flow of Ga or Sb precursor while continuing the flow of an inert carrier gas such as nitrogen or argon.

Preferably, the Ga source is GaX$_3$, wherein X is a halogen element. In some embodiments the Ga source is GaCl$_3$. In some embodiments Ga source is gallium alkyl compound, such as trimethylgallium (TMG). In some embodiments the Ga source is a gallium betadiketonate.

The Sb precursor can be any of the Sb precursors described herein. Preferably, the second Sb precursor has a formula of Sb(SiR$^1$R$^2$R$^3$)$_3$, wherein R$^1$, R$^2$, and R$^3$ are alkyl groups comprising one or more carbon atoms. The R$^1$, R$^2$, and R$^3$ alkyl groups can be selected based on the desired physical properties of the precursor such as volatility, vapor pressure, toxicity, etc.

The substrate temperature during forming the Ga—Sb thin film is preferably less than 500° C. and more preferably less than 350° C. and even more preferably below 200° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Ga—Sb thin film.

Preferably the Ga and Sb reactants are pulsed for about 0.05 to 10 seconds, more preferably about 0.2 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes.

In some embodiments the deposited Ga—Sb thin films are amorphous. In some embodiments, the deposited Ga—Sb thin films are crystalline.

In some embodiments, the deposited Ga—Sb film can be annealed.

ALD Processes Using Sb Precursors for Depositing Materials Comprising Sb and Co

Skutterudites such as CoSb$_3$, CeFe$_{4-x}$Co$_x$Sb$_{12}$ and LaFe$_{4-x}$Co$_x$Sb$_{12}$ have been studied for their potential use as thermoelectric materials.

In some embodiments, a thin film comprising Co and Sb is formed by ALD without the use of plasma. A thin film comprising Co and Sb is formed on a substrate by an ALD type process comprising multiple deposition cycles, each deposition cycle comprising:

providing a first vapor phase reactant pulse comprising a Co precursor into the reaction chamber to form no more than about a single molecular layer of the Co precursor on the substrate;

removing excess first reactant from the reaction chamber;

providing a second vapor phase reactant pulse comprising a Co precursor to the reaction chamber such that the Sb precursor reacts with the Co precursor on the substrate; and removing excess second reactant and reaction byproducts, if any, from the reaction chamber.

This can be referred to as the Co—Sb deposition cycle. Each Co—Sb deposition cycle typically forms at most about one monolayer of Co—Sb. The Co—Sb deposition cycle is repeated until a film of a desired thickness is formed. In some embodiments a Co—Sb film of from about 10 Å to about 2000 Å is formed.

The x and y values and composition of the $Co_xSb_y$ film can vary. In some embodiments, x and y are less than 1. In some embodiments, the sum of x and y is equal to about 1, or 100 if the x and y values are expressed as a percentage.

Although the illustrated Co—Sb deposition cycle begins with provision of the Co precursor, in other embodiments the deposition cycle begins with the provision of the Sb precursor.

In some embodiments, the reactants and reaction by-products can be removed from the reaction chamber by stopping the flow of Sb or Co precursor while continuing the flow of an inert carrier gas such as nitrogen or argon.

Preferably, the Co source is Co-amidinate or Co-betadiketonate, such as $Co(acac)_2$, $Co(acac)_3$, $Co(thd)_2$ or $Co(thd)_3$.

The Sb precursor can be any of the Sb precursors described herein. Preferably, the second Sb precursor has a formula of $Sb(SiR^1R^2R^3)_3$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc.

Further materials or dopants that can be included in the Co—Sb deposition cycles include transition metals such as Fe, La or Ce. Other dopants selected from the group consisting of O, N, C, Si, Sn, Ag, Al, Ga, P, Fe, Ge, In, Ag, Se, Te or Bi, but not limited to those may also be introduced into film.

The substrate temperature during forming the Co—Sb thin film is preferably less than 500° C. and more preferably less than 350° C. and even more preferably below 200° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Co—Sb thin film.

Preferably the Co and Sb reactants are pulsed for about 0.05 to 10 seconds, more preferably about 0.2 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes.

In some embodiments the deposited Co—Sb thin films are amorphous. In some embodiments, the deposited Co—Sb thin films are crystalline.

In some embodiments, the deposited Co—Sb film can be annealed.

ALD Processes Using Sb Precursors for Depositing Zn—Sb

Also ZnSb has also been studied for its potential use as a thermoelectric material. In some embodiments, a thin film comprising Zn—Sb is formed by ALD without the use of plasma. An Zn—Sb thin film is formed on a substrate by an ALD type process comprising multiple Zn—Sb deposition cycles, each deposition cycle comprising:

providing a first vapor phase reactant pulse comprising a Zn precursor into the reaction chamber to form no more than about a single molecular layer of the Zn precursor on the substrate;

removing excess first reactant from the reaction chamber;

providing a second vapor phase reactant pulse comprising a Zn precursor to the reaction chamber such that the Sb precursor reacts with the Zn precursor on the substrate; and removing excess second reactant and reaction byproducts, if any, from the reaction chamber.

This can be referred to as the Zn—Sb deposition cycle. Each Zn—Sb deposition cycle typically forms at most about one monolayer of Zn—Sb. The Zn—Sb deposition cycle is repeated until a film of a desired thickness is formed. In some embodiments a Zn—Sb film of from about 10 Å to about 2000 Å is formed.

The x and y values and composition of the $Zn_xSb_y$ film can vary. In some embodiments, x and y are less than 1. In some embodiments, the sum of x and y is equal to about 1, or 100 if the x and y values are expressed as a percentage.

Although the illustrated Zn—Sb deposition cycle begins with provision of the Zn precursor, in other embodiments the deposition cycle begins with the provision of the Sb precursor.

In some embodiments, the reactants and reaction by-products can be removed from the reaction chamber by stopping the flow of Zn or Sb precursor while continuing the flow of an inert carrier gas such as nitrogen or argon.

Preferably, the Zn source is $ZnX_2$, wherein X is a halogen element. In some embodiments the Zn source is $ZnCl_2$. In some embodiments Zn source is zinc alkyl compound, such as dimethylzinc or ditehylzinc.

The Sb precursor can be any of the Sb precursors described herein. Preferably, the second Sb precursor has a formula of $Sb(SiR^1R^2R^3)_3$, wherein $R^1$, $R^2$, and $R^3$ are alkyl groups comprising one or more carbon atoms. The $R^1$, $R^2$, and $R^3$ alkyl groups can be selected based on the desired physical properties of the precursor such as volatility, vapor pressure, toxicity, etc.

The substrate temperature during forming the Zn—Sb thin film is preferably less than 500° C. and more preferably less than 350° C. and even more preferably below 200° C. If an amorphous thin film is desired the temperature can be lowered even further down to at or below about 90° C. In some embodiments the deposition temperature can be below about 80° C., below about 70° C., or even below about 60° C.

The skilled artisan can determine the optimal reactant evaporation temperatures based on the properties of the selected precursors.

The skilled artisan can determine the optimal reactant pulse times through routine experimentation based on the properties of the selected precursors and the desired properties of the deposited Zn—Sb thin film.

Preferably the Zn and Sb reactants are pulsed for about 0.05 to 10 seconds, more preferably about 0.2 to 4 seconds. The purge steps in which excess reactant and reaction by-products, if any, are removed are preferably about 0.05 to 10 seconds, more preferably about 0.2-4 seconds. In some cases like in batch ALD reactors the pulse and purge times can vary much more and longer pulse times may be used even in order of minutes.

In some embodiments the deposited Zn—Sb thin films are amorphous. In some embodiments, the deposited Zn—Sb thin films are crystalline.

In some embodiments, the deposited Zn—Sb film can be annealed.

ALD Processes Using Group VA Precursors Comprising as, Bi, and P

In some embodiments, precursors comprising As, Bi, or P can be substituted for any of the Sb precursors described herein. In some embodiments the As precursor is As(SiMe$_2^t$Bu)$_3$, As(SiEt$_3$)$_3$, or As(SiMe$_3$)$_3$. In some embodiments the Bi precursor is Bi(SiMe$_2^t$Bu)$_3$, Bi(SiEt$_3$)$_3$, or Bi(SiMe$_3$)$_3$. In some embodiments the P precursor is P(SiMe$_2^t$Bu)$_3$, P(SiEt$_3$)$_3$, or P(SiMe$_3$)$_3$.

In some embodiments, thin films comprising As can be made including: As—Te, As—Se, In—As, Ga—As, In—Ga—As, As—S and Al—As. Any of the precursors and compounds described herein can be used with the As precursors. In some preferred embodiments the As precursor is As(SiMe$_2^t$Bu)$_3$, As(SiEt$_3$)$_3$, or As(SiMe$_3$)$_3$.

In some embodiments, thin films comprising Bi can be made including: elemental Bi, Bi—Te, Bi—Se, In—Bi, Sb—Bi, Ga—Bi, and Al—Bi. Any of the precursors and compounds described herein can be used with the Bi precursors. In some preferred embodiments the Bi precursor is Bi(SiMe$_2^t$Bu)$_3$, Bi(SiEt$_3$)$_3$, or Bi(SiMe$_3$)$_3$.

In some embodiments, thin films comprising P can be made including: P—Te, P—Se, In—P, Ga—P, Cu—P and Al—P. Any of the precursors and compounds described herein can be used with the P precursors. In some preferred embodiments the P precursor is P(SiMe$_2^t$Bu)$_3$, P(SiEt$_3$)$_3$, or P(SiMe$_3$)$_3$.

In some embodiments a Ga—As film is deposited using GaCl$_3$ and As(SiH$_3$)$_3$ as precursors.

In some embodiments a film comprising a Group III-V compound semiconductor film is deposited having a formula of (M$^1$, M$^2$, M$^3$)(A$^1$, A$^2$, A$^3$) i.e. M$^1_x$M$^2_y$M$^3_z$A$^1_p$A$^2_k$A$^3_l$, where M's can be selected from Al, Ga or In and A's can be selected from P, As, Sb. In some embodiments the Group III-V compound semiconductor film is a ternary compound, such as (Ga, Al)As, Ga(As, Sb) or (Ga, In)As film. In some embodiments the Group III-V compound semiconductor film is a quaternary compound film, such as a (Ga, In)(As, P) film or a (Al, In, Ga)P film.

Example 5

Ga—As films were deposited using GaCl$_3$ and As(SiEt$_3$)$_3$ as precursors. 500 cycles of Ga—As were used to deposit Ga—As on a silicon substrate with native oxide. Reaction temperatures were 100° C. and 120° C. The As(SiEt$_3$)$_3$ source temperature was from about 50° C. to about 70° C. The GaCl$_3$ was held at room temperature. Each Ga—As cycle was:

a 0.5 second GaCl$_3$ pulse;
a 2 second purge;
a 1 second As(SiEt$_3$)$_3$ pulse; and
a 2 second purge.

The Ga—As films were characterized by EDX analysis as Ga$_{0.58}$As$_{0.42}$. The growth rate for the Ga$_{0.58}$As$_{0.42}$ films were approximately from about 0.5 Å/cycle to about 0.7 Å/cycle. EDX analysis also found that some chlorine and oxygen was present in the deposited Ga—As films. It is to be noted that these processes are not optimized and therefore some impurities in the films are not uncommon.

ALD Processes Using Precursors Comprising N

In some embodiments, precursors comprising N can be substituted for the Sb precursors described herein and used in the ALD cycles. In some embodiments the precursor comprising N is N(SiMe$_2^t$Bu)$_3$, N(SiH$_3$)$_3$, N(SiEt$_3$)$_3$, or N(SiMe$_3$)$_3$. In some embodiments the precursor comprising N is N(SiMe$_3$)H. In some embodiments the precursor comprising N described herein is not N(SiH$_3$)$_3$.

In some embodiments, the precursors comprising N can be used in an ALD cycle with a precursor comprising B, Al, Ga, or In to deposit a thin film including: B—N, Al—N, Ga—N and In—N.

In some embodiments a film comprising a Group III-V compound semiconductor film is deposited having a formula of (M$^1$, M$^2$, M$^3$)N i.e. M$^1_x$M$^2_y$M$^3_z$N, where M's can be selected from Al, Ga or In. In some embodiments the Group III-V compound semiconductor film comprises a ternary compound, such as (Ga,In)N, Ga(N,P), (Ga,Al)N or (Al, In)N film. In some embodiments the Group III-V compound semiconductor film comprises a quaternary compound, such as (Ga,In)(N,P), (Ga, In)(As, N), (Al, In)(N, P) or (Al, In, Ga)N.

Nanolaminates

Controlling the composition of materials with three or more elements (ternary or higher) can be difficult. However, it is easier to control the composition of binary materials deposited by ALD.

In some embodiments, multiple ALD cycles can be used to deposit a first film followed by multiple ALD cycles to form a second film having a composition different from the first film. In some embodiments, two or more cycles are used to deposit the first film. In some embodiments, two or more cycles are used to deposit the second film.

The stoichiometry of the resulting film can be precisely controlled by varying the ratio of the second cycles. The thickness of each deposited layer can be controlled by selecting the number ALD cycles.

In some embodiments, multiple ALD cycles can be used to deposit about a nanometer or more of the first or second film. In some embodiments, preferably about 1 to 6 nm of material is deposited.

In some embodiments, multiple first and second films are formed. For example, the first and second cycles can be alternated to form alternating thin films of the first and second films.

In some embodiments, three or more films with different compositions can be used to form a film having a desired composition, crystal structure, and other physical properties.

The first and second films can be any of the materials described herein. Preferably, the deposited film can comprise one or more of: Sb, Sb—Te, GeTe, Ge—Sb—Te, Sb$_2$Te$_3$, Sb$_2$Te, Ge—Sb, Ge$_2$Sb$_2$Se$_5$, Bi—Te, Bi—Se, Zn—Te, ZnSe, CuInSe$_2$, and Cu(In,Ga)Se$_2$. In some embodiments, one or more dopants selected from the group consisting of O, N, C, Si, Sn, Ag, Al, Ga, P, Fe, Ge, In, Ag, Se, Te or Bi, but not limited to those, is introduced into film.

In some embodiments, the thin film can comprise a dielectric material. In some embodiments, the dielectric material can comprise SiO$_2$, TiO$_2$, Al$_2$O$_3$, ZrO$_2$, and HfO$_2$. In some embodiments, a dielectric material can be formed in combination with the phase change materials disclosed herein. For example, in one embodiment, SiO$_2$ can be deposited with Ge—Sb—Te thin films. The use of a dielectric layer with a phase change material can modify the crystallization temperatures, resistivity, stability and other characteristics of the deposited film.

Other deposition processes known in the art can also be used to deposit the nanolaminates materials, for example, CVD, RTCVD, etc.

In some embodiments, Sb—Te and Ge—Te cycles are used to deposit alternating layers of $Sb_2Te_3$ and Ge—Te. The stoichiometry of the resulting film can be precisely controlled by varying the ratio of the Sb—Te and Ge—Te cycles. The thickness of each deposited layer can be controlled by selecting the number of Sb—Te and Ge—Te cycles.

In some embodiments, Sb, Sb—Te, and Ge—Te cycles are used to deposit alternating layers of Sb, $Sb_2Te_3$, and Ge—Te.

In some embodiments, Sb—Se and Ge—Se cycles are used to deposit alternating layers of $Sb_2Se_3$ and Ge—Se.

In some embodiments, Sb, Sb—Se, and Ge—Se cycles are used to deposit alternating layers of Sb, $Sb_2Se_3$, and Ge—Se.

In some embodiments, the thin film is crystalline as deposited. In some embodiments, the thin film is amorphous as deposited.

In some embodiments, the thin film can be annealed in the presence of an inert gas, such as nitrogen. In some embodiments, annealing can modify the crystal structure of the deposited thin film.

The nanolaminate thin films can have superior properties to bulk films. For example, a nanolaminate with 2-6 nm thick individual layers can exhibit lower programming currents and faster working times than a bulk GST film with the same total thickness.

Example 6

Figure 11:
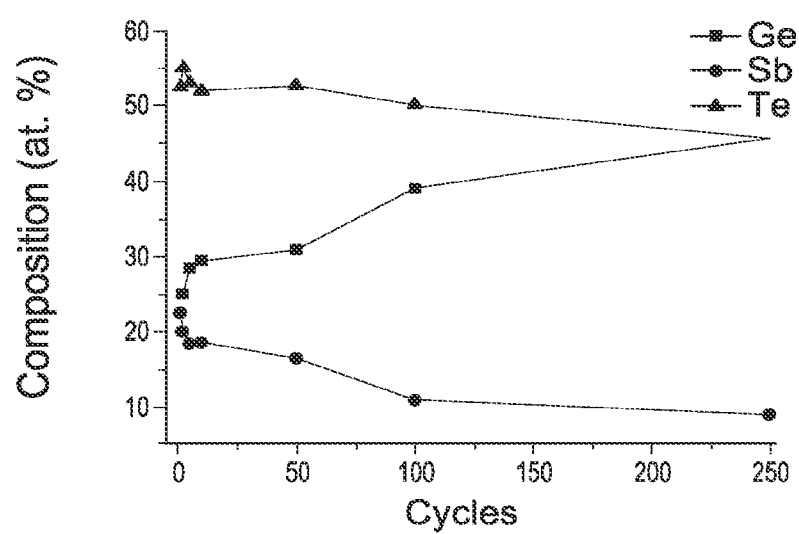
FIG. 11 is a graph of nanolaminate composition as a function of the amount of GeTe and $Sb_2Te_3$ subcycles.

GeTe/$Sb_2Te_3$ (GT/ST)-nanolaminate samples were prepared at 80° C. using 1000 total applied cycles. The following cycle sequences were used: (A) 250×(2GT+2ST), (B) 100×(5GT+5ST), (C) 50×(10GT+10ST), (D) 10×(50GT+50ST), (E) 5×(100GT+100ST) and (F) 2×(250GT+250ST). A reference GST film using a sequence 500×(GT+ST) was also prepared. As deposited films D, E and F were crystalline with the cubic structure. All other films were amorphous. The composition was studied by EDX. FIG. 11 shows the film composition as a function of the applied subcycles. It can be seen that the Sb content decreases and the Ge content increases as the amount of subcycles increases.

Figure 12:
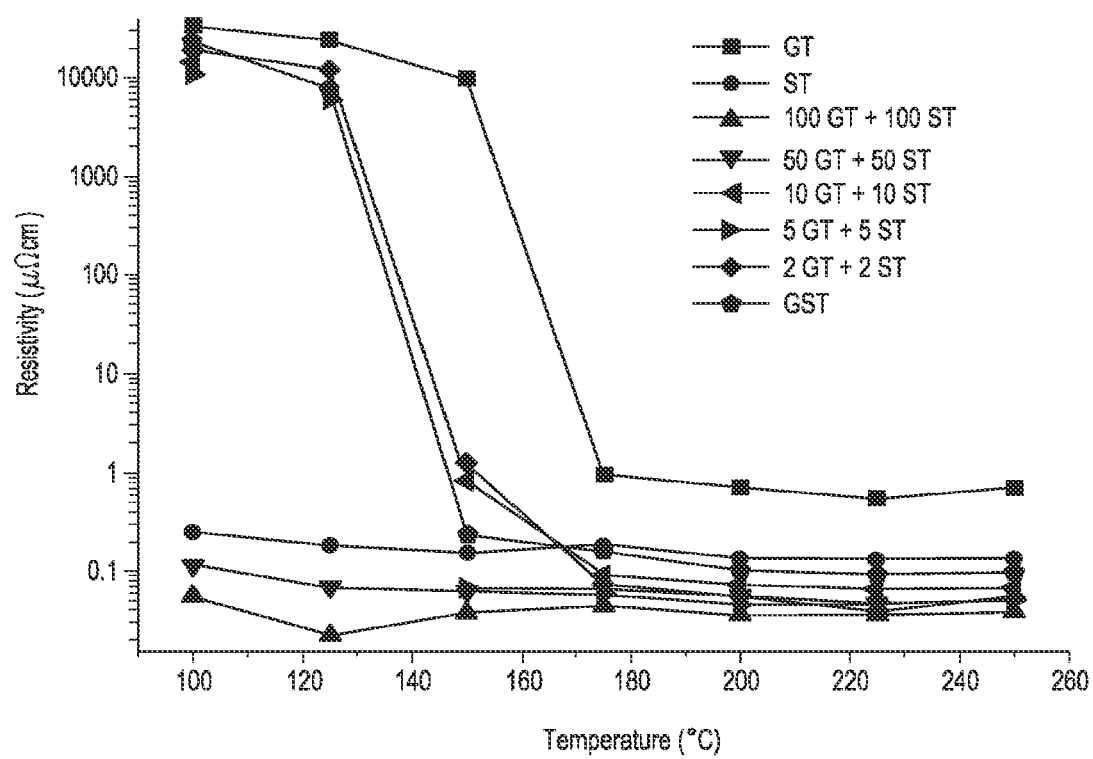
FIG. 12 is a graph of resistivity of GeTe, $Sb_2Te_3$, GST and the nanolaminates as a function of annealing temperature.

Resistivities of the nanolaminate samples as well as GeTe, $Sb_2Te_3$ and GST samples were measured after annealing at different temperatures under a N2 flow (FIG. 12). The crystalline samples were already at a high conductivity state as expected. The amorphous nanolaminate samples crystallized between 125-150° C. causing their resistivity to decrease 4-5 orders of magnitude. The crystallization temperature of the GeTe sample was between 150 and 175° C.

Figure 13A:
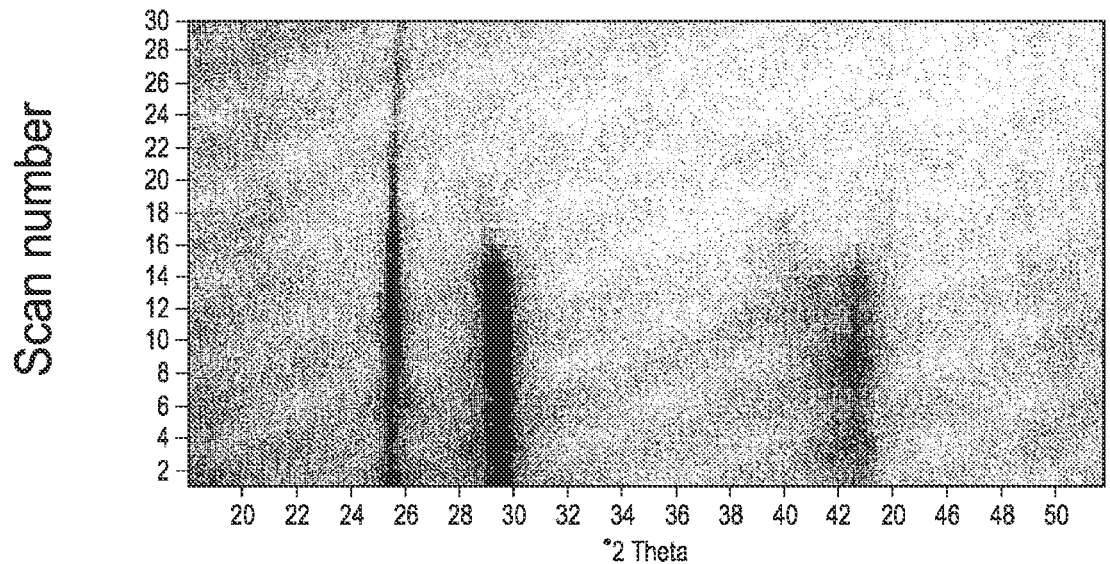
FIGS. 13A and 13B are a HTXRD measurement from room temperature to 405° C. of samples D (13A) and C (13B).

High temperature XRD (HTXRD) measurements to 405° C. under N2 were conducted for samples A-E. The cubic structure of samples D and E was retained during the measurement. Initially amorphous samples A-C with the smaller amounts of subcycles crystallized at 150° C. to the cubic phase and later on at 350° C. to the stable hexagonal phase (FIGS. 13a and 13b)

In conclusion, by use of nanolaminates the film composition, crystal structure and resistivity can be tailored.

Figure 13B:
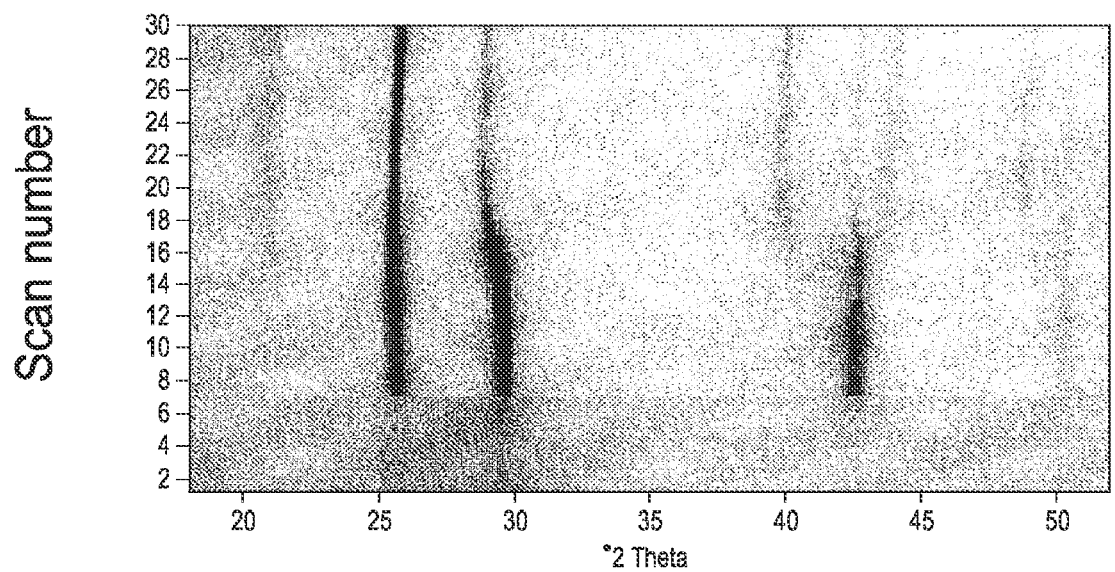
Figure 14:
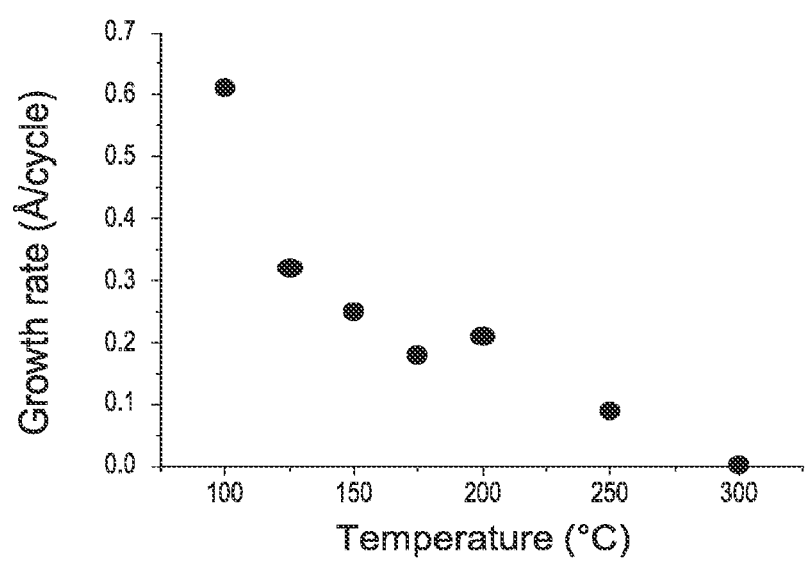
FIG. 14 is a graph of the average growth rate per cycle for Sb thin films versus deposition temperature.
Figure 15:
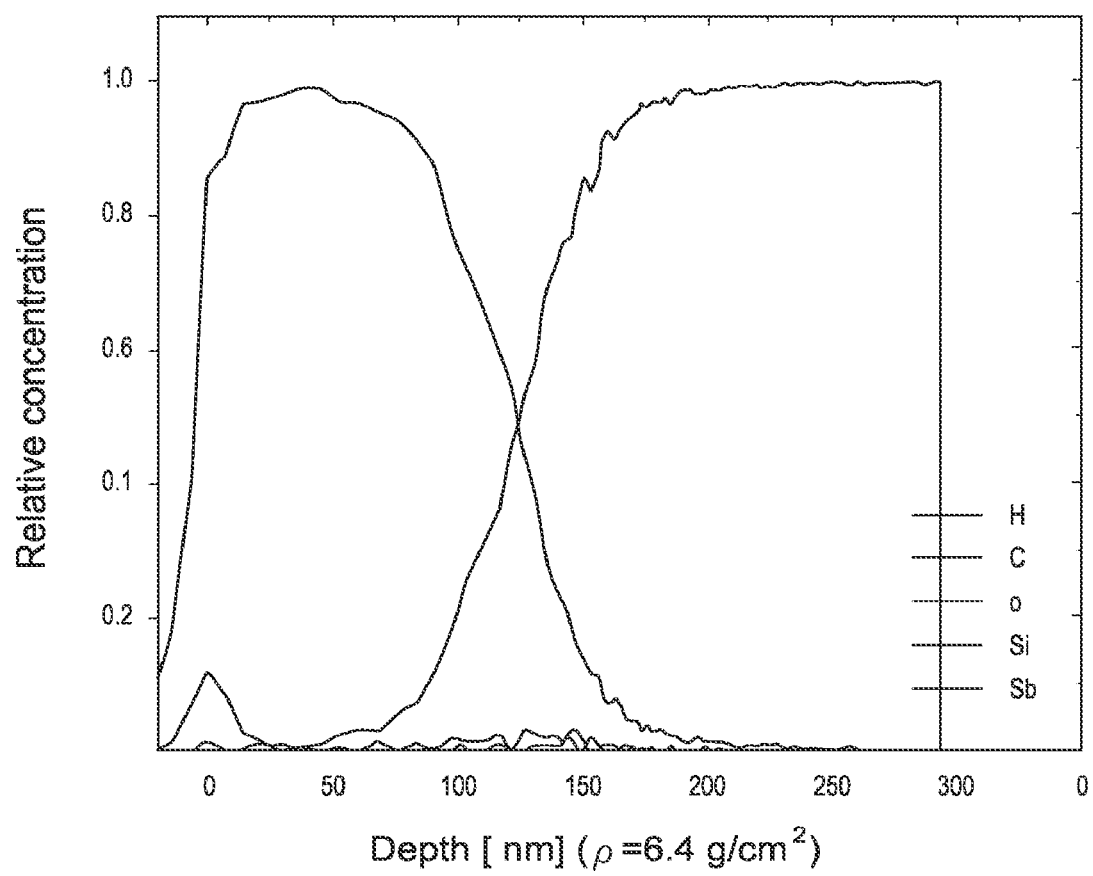
FIG. 15 is a time-of-flight elastic recoil detection analysis (TOF-ERDA) of a Sb film deposited at 100° C. by ALD.
Figure 16A:
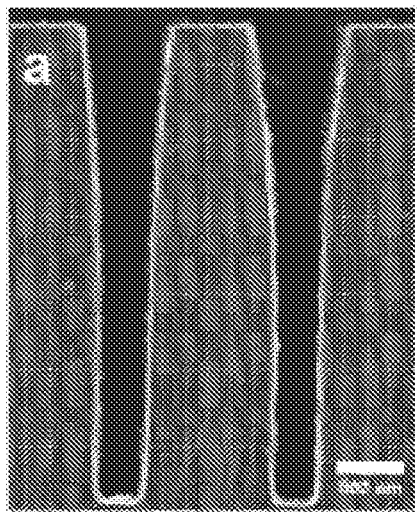
FIG. 16A illustrates a Sb film deposited on a high aspect ratio trench structure and FIGS. 16B-16D are Sb nanotubes.
Figure 16B:
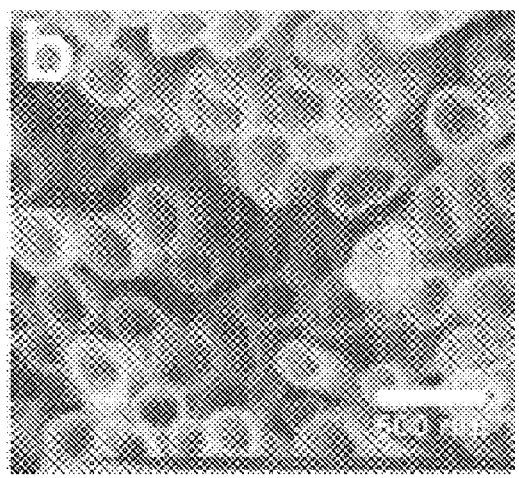
Figure 16C:
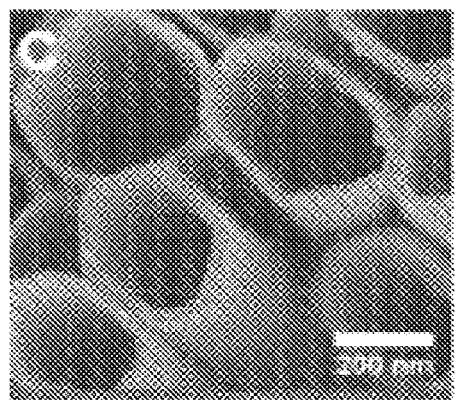
Figure 16D:
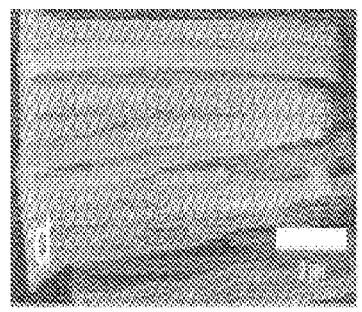
Figure 17:
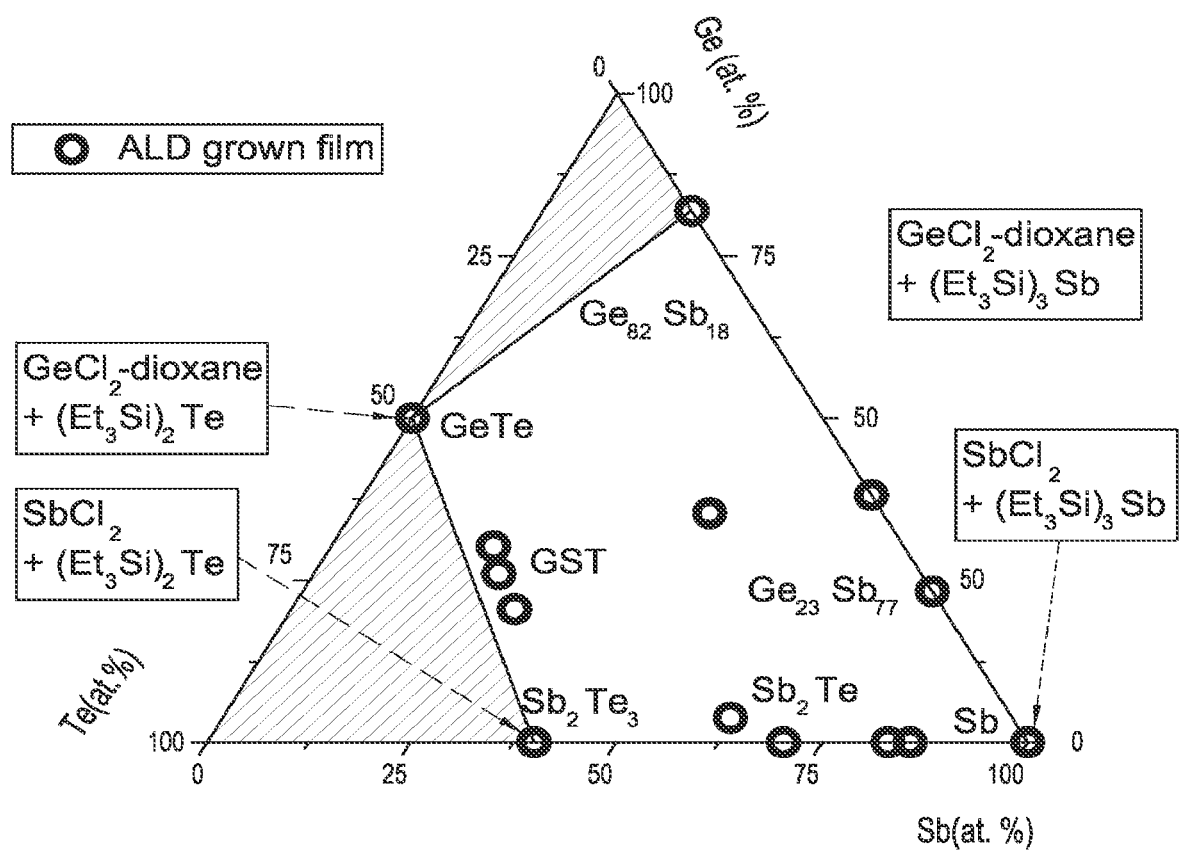
FIG. 17 is a graph illustrating various compositions of Ge—Te—Sb thin films formed by various ALD processes.
Figure 18:
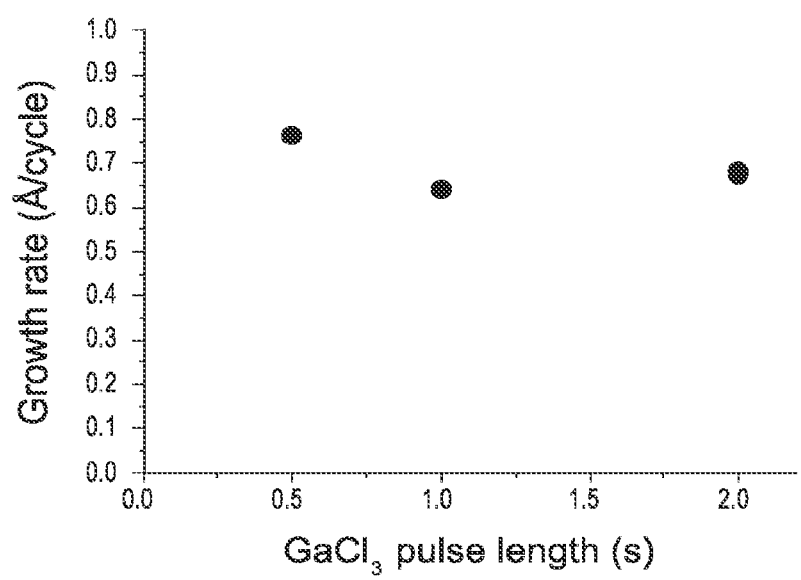
FIG. 18 is a graph of the average growth rate per cycle for Ga—Sb thin films versus $GaCl_3$ precursor pulse length.
Figure 19:
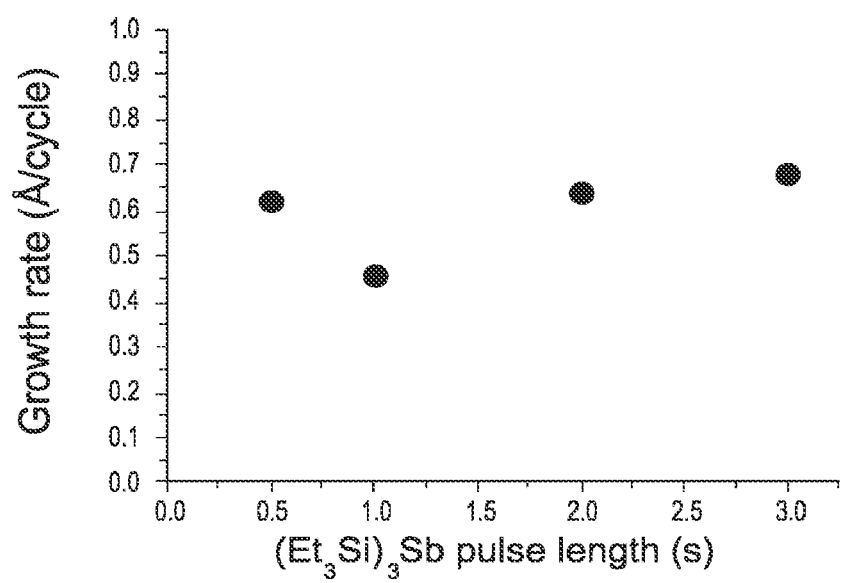
FIG. 19 is a graph of the average growth rate per cycle for Ga—Sb thin films versus $(Et_3Si)_3Sb$ precursor pulse length.
Figure 20:
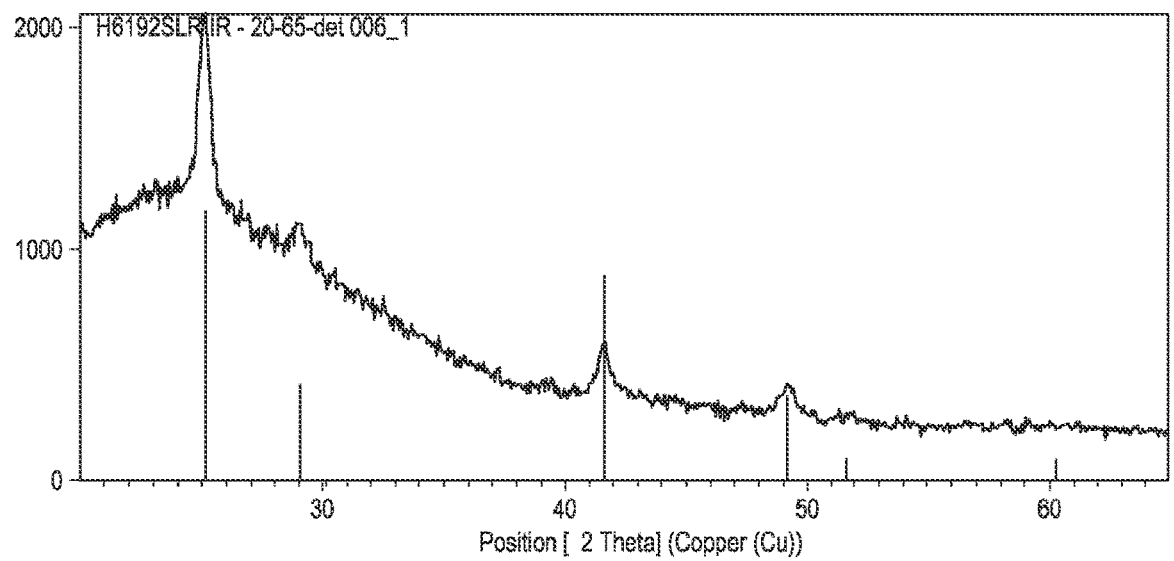
FIG. 20 is a graph of the composition of a Al—Sb film as measured by EDX analysis.
Figure 21:
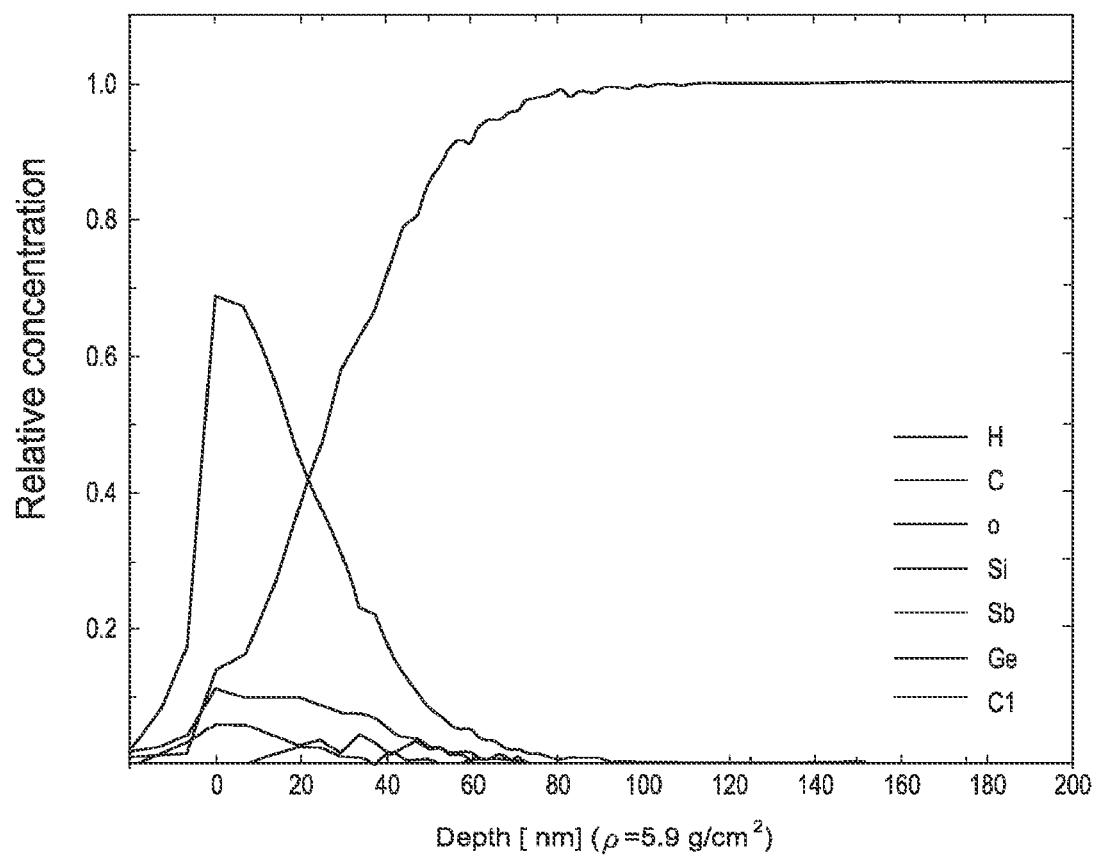
FIG. 21 is a TOF-ERDA depth profile of a $Ge_{22}Sb_{78}$ thin film deposited by ALD.
Figure 22:
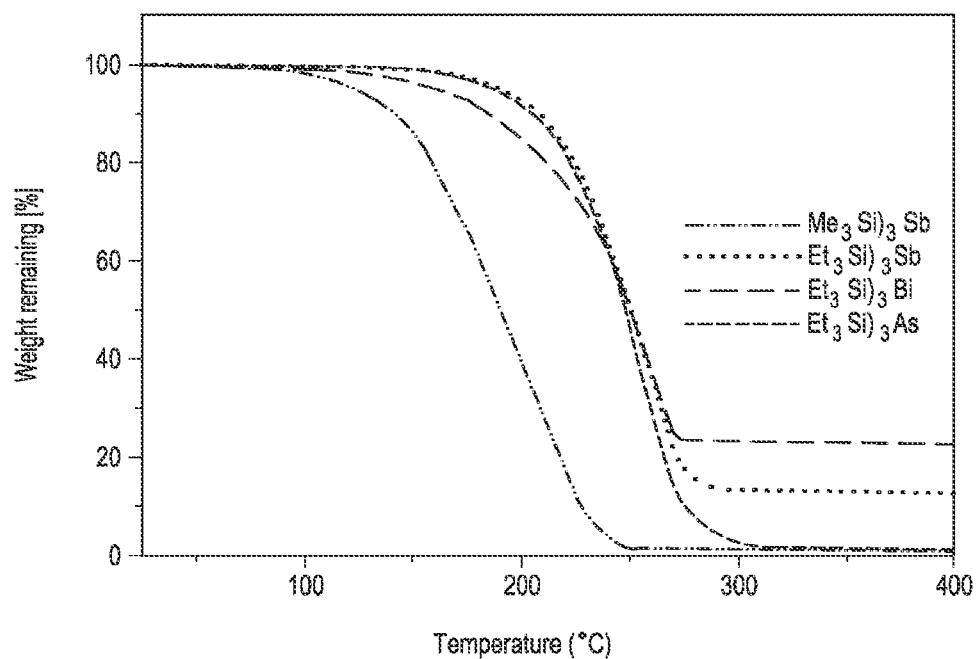
FIG. 22 is a thermal gravimetric analysis (TGA) graph of $Sb(SiMe_3)_3$, $Sb(SiEt_3)_3$, $As(SiEt_3)_3$ and $Bi(SiEt_3)_3$, which have been synthesized.

HTXRD measurements from room temperature to 405° C. of samples D (FIG. 13a) and C (FIG. 13b). Scan numbers 1-20 represent heating from room temperature to 405° C. and 21-30 cooling down back to room temperature.

Group VA Precursor Synthesis

Methods are also provided for making some of the Group VA precursors used in the ALD processes described herein. In some embodiments, the group VA element is As, Sb, Bi, or P. In some embodiments, precursors are synthesized having a formula of $L(SiR^1R^2R^3)_3$, wherein L is As, Sb, Bi, or P and $R^1$, $R^2$, and $R^3$ are preferably alkyl groups with one or more carbon atoms. In some embodiments the Group VA precursor that is synthesized has a formula of $L(SiMe_3)_3$ and in other embodiments has a formula of $L(SiEt_3)_3$ with L being As, Sb, Bi, or P.

In particular, Sb precursors having a formula of $Sb(SiR^1R^2R^3)_3$, wherein $R^1$, $R^2$, and $R^3$ are preferably alkyl groups with one or more carbon atoms, can be synthesized. In some embodiments the Sb precursor that is synthesized is $Sb(SiMe_3)_3$ and in other embodiments is $Sb(SiEt_3)_3$.

Figure 10:
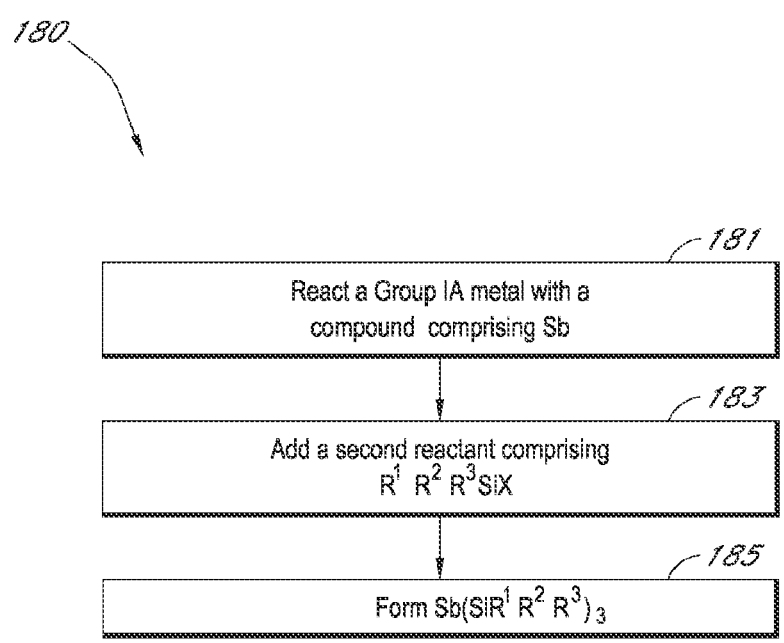
FIG. 10 a flow chart generally illustrating a method for synthesizing a compound having the formula $Sb(SiR^1R^2R^3)_3$ in accordance with one embodiment.

FIG. 10 is a flowchart generally illustrating methods for forming Sb precursors. In some embodiments the process for making a Sb precursor comprises:

forming a first product by reacting a Group IA metal with a compound comprising Sb, preferably elemental Sb; and subsequently adding a second reactant comprising $R^1R^2R^3SiX$ to the first product, wherein $R^1$, $R^2$ and $R^3$ are alkyl groups with one or more carbon atoms and X is a halogen atom, thereby forming $Sb(SiR^1R^2R^3)_3$.

In some embodiments, a Group IA elemental metal, such as Li, Na, K, etc. is combined with elemental Sb. Preferably, the Group IA element is provided as a powder or flakes and the elemental Sb is provided as a metal powder.

In some embodiments, a solvent, preferably a hydrocarbon, either aromatic or non-aromatic compound, which has a suitable boiling point, such as tetrahydrofuran (THF, $(CH_2)_4O$), or dimethoxyethane (DME, $CH_3OCH_2CH_2OCH_3$) is added to the Group IA metal and Sb. Preferably, naphthalene ($C_{10}H_8$) is added to the mixture, for example it might facilitate the solubility of IA metal and therefore also to help reduce Sb. In some embodiments, ammonia can be used to catalyze the reaction instead of naphthalene. In some embodiments the solvent is toluene or xylene. In some embodiments the solvent is s ether, with suitable boiling point.

In some embodiments, the mixture is heated and a reflux condenser is used to reflux the solution under an inert gas, such as argon, until completion of the reaction. A pressure vessel heated to a desired temperature can also be used instead of a reflux condenser. After a desired intermediate product is formed, the solution can be cooled down.

In some embodiments, a silicon containing compound is then added to the mixture. Preferably, the silicon containing compound has a formula of $R^1R^2R^3SiX$, wherein $R^1$, $R^2$, and $R^3$ are preferably alkyl groups with one or more carbon atoms and X is preferably a halogen atom. $R^1$, $R^2$, and $R^3$ can be chosen based on the desired precursor properties of the final product, including vapor pressure, melting point, etc. In some embodiments $R^1$, $R^2$, and $R^3$ can all be the same group. In other embodiments, $R^1$, $R^2$, and $R^3$ can all be different groups. In some embodiments, $R^1$, $R^2$, and $R^3$ are all ethyl groups (Et). In some embodiments, $R^1$, $R^2$, and $R^3$ are all methyl groups (Me). In other embodiments $R^1$ and $R^2$ are methyl groups and $R^3$ is a tertbutyl group ($Me_2{}^tBu$). In some embodiments, X is Cl. In some preferred embodiments, the silicon containing compound has a formula of $Et_3SiCl$ or $Me_3SiCl$.

The mixture is continuously stirred until the reaction is complete. In some embodiments the mixture is refluxed or heated under inert gas until completion of the reaction. After the reaction is substantially complete, the final product is separated and isolated from any solvents, by-products, excess reactants, or any other compounds that are not desired in the final product. The product can be a solid or liquid at standard temperature and pressure.

Other methods can also be used to produce the Sb precursors. In some embodiments, $(R_3Si)_3Sb$ compounds can be produced by reacting $R_3SiH$ with $SbR_3$ compounds. In some embodiments, $(SiR_3)_3Sb$ compounds can be produced by reacting $R_3SiLi$ with $SbCl_3$ compounds.

Example 7

$Sb(SiMe_3)_3$ was produced by the following process. First, 2.02 g of sodium and was added to 200 ml of dry THF. 3.56 g of Sb powder and 0.1 g (5.47 mmol) of naphthalene were added to the sodium and THF mixture in a 350 ml Schlenk bottle. The resultant mixture was stirred and refluxed for 48 hours. The mixture was then cooled to room temperature.

Next, 9.55 g of $Me_3SiCl$ was added to the mixture. The mixture was stirred and refluxed for 48 hours. Vacuum was used to remove unreacted $Me_3SiCl$ and solvent. 100 ml of toluene was added to the mixture to facilitate filtering of the mixture. The toluene solution was then filtered. The filtrate including the product solvent and volatile impurities were removed using a vacuum.

The recovered product weighed about 2.5 g resulting in a calculated reaction efficiency of about 25%. The composition of the product was verified to be $Sb(SiMe_3)_3$ by nuclear magnetic resonance (NMR) and mass spectroscopy (MS). The $Sb(SiMe_3)_2$ produced had a boiling point of about 88° C. at a pressure of 2 Torr.

Example 8

$Sb(SiEt_3)_3$ was produced by a process similar to that described in Example 7. First, 0.45 g of lithium was added to 300 ml of dry THF along with 2.60 g of Sb powder and 0.1 g of naphthalene in a 350 ml Schlenk bottle. The resultant mixture was stirred and refluxed for 48 hours. The mixture was then cooled to room temperature.

Next, 9.68 g of $Et_3SiCl$ was added to the mixture. The mixture was refluxed for 48 hours. Vacuum was used to remove unreacted $Et_3SiCl$ and unreacted solvent. 100 ml of toluene was added to the mixture to facilitate filtering of the mixture. The toluene solution was then filtered. The filtrate including the product solvent and volatile impurities were removed using a vacuum.

The recovered product weighed about 0.5 g resulting in a calculated reaction efficiency of about 5%. The composition of the product was verified to be $Sb(SiEt_3)_2$ by nuclear magnetic resonance (NMR) and mass spectroscopy (MS). The $Sb(SiEt_3)_2$ produced had a boiling point of about 148-153° C. at a pressure of 1 Torr.

Example 9

$Sb(SiEt_3)_3$ was produced by a process similar to that described in Example 7. First 4.2 g of sodium was added to 200 ml of dry DME (dimethoxyethane, $CH_3OCH_2CH_2OCH_3$) along with 7.4 g of Sb powder and 0.4 g naphthalene in 600 ml Schlenk bottle. The resultant mixture was stirred and refluxed for approximately 70 hours. The mixture was then cooled to room temperature.

Next 30.0 g of $Et_3SiCl$ was added to the mixture. The mixture was refluxed for 96 hours. Vacuum was used to remove unreacted $Et_3SiCl$ and solvent. 100 ml of hexane was added to the mixture to facilitate filtering of the mixture.

The hexane solution was then filtered. The filtrate, including the product was then evaporated to dryness.

The recovered product weighed about 21.3 g giving a yield of 77.5%. The composition of the product was verified to be $Sb(SiEt_3)_3$ by nuclear magnetic resonance (NMR) and mass spectroscopy (MS). The $Sb(SiEt_3)_3$ produced had a boiling point of about 150° C. at a pressure of 1 torr.

Example 10

$As(SiEt_3)_3$ was produced by a process similar to that described in Example 7. First 0.86 g of sodium was added to 150 ml of dry DME (dimethoxyethane, $CH_3OCH_2CH_2OCH_3$) along with 0.89 g of As powder and 0.1 g naphthalene in 350 ml Schlenk bottle. The resultant mixture was stirred and refluxed for approximately 24 hours. The mixture was then cooled to −10° C.

Next 6.0 g of $Et_3SiCl$ was added to the mixture. The mixture was refluxed for 24 hours. Vacuum was used to remove unreacted $Et_3SiCl$ and solvent. 100 ml of hexane was added to the mixture to facilitate filtering of the mixture. The hexane solution was then filtered. The filtrate including the product solvent and volatile impurities were removed using a vacuum.

The recovered product weighed about 2.8 g giving a yield of 56%. The composition of the product was verified to be $As(SiEt_3)_3$ by nuclear magnetic resonance (NMR) and mass spectroscopy (MS).

Example 11

$Bi(SiEt_3)_3$ was produced by a process similar to that described in Example 7. First 0.76 g of sodium was added to 100 ml of dry DME (dimethoxyethane, $CH_3OCH_2CH_2OCH_3$) along with 2.31 g of Bi powder and 0.1 g naphthalene in 350 ml Schlenk bottle. The resultant mixture was stirred and refluxed for approximately 24 hours plus 4 days at room temperature. The mixture was then cooled to −10° C.

Next 5.25 g of $Et_3SiCl$ was added to the mixture. The mixture was refluxed for 24 hours. Vacuum was used to remove unreacted $Et_3SiCl$ and solvent. 100 ml of hexane was added to the mixture to facilitate filtering of the mixture. The hexane solution was then filtered. The filtrate including the product solvent and volatile impurities were removed using a vacuum.

The recovered product weighed about 3.2 g giving a yield of 52%. The composition of the product was verified to be $Bi(SiEt_3)_3$ by nuclear magnetic resonance (NMR) and mass spectroscopy (MS).

Precursors Comprising Group VA Elements and Synthesis

Precursors comprising As, Bi and P, such as $(R_3Si)_3As$, $(R_3Si)_3P$, and $(R_3Si)_3Bi$ can also be synthesized using similar methods to those described here for Sb.

Methods for synthesizing precursors comprising N bonded to Sn can be found, for example from Sisido et al. Journal of Organic Chemistry (1964), 29(4), 907-9 and Lehn et al. Journal of the American Chemical Society (1964), 86(2), 305.

It will be appreciated by those skilled in the art that various modifications and changes can be made without departing from the scope of the invention. Similar other modifications and changes are intended to fall within the scope of the invention, as defined by the appended claims.

We claim:

1. An atomic layer deposition (ALD) process for forming a thin film on a substrate, the process comprising a plurality of deposition cycles each comprising:
    contacting the substrate with a first vapor phase reactant; and
    contacting the substrate with a second vapor phase reactant, wherein the second vapor phase reactant comprises $Bi(AR^1R^2R^3)_3$, wherein $R^1$, $R^2$, and $R^3$ are independent alkyl groups comprising one or more carbon atoms and A is Si or Ge.

2. The process of claim 1, wherein the second vapor phase reactant comprises $Bi(SiMe_2{}^tBu)_3$, $Bi(SiEt_3)_3$ or $Bi(SiMe_3)_3$.

3. The process of claim 2, wherein the second vapor phase reactant comprises $Bi(SiMe_3)_3$.

4. The process of claim 1, wherein any one or more of $R^1$, $R^2$, and $R^3$ comprises a heteroatom selected from the group of N, O, F, Si, P, S, Cl, Br and I.

5. The process of claim 1, wherein any one or more of $R^1$, $R^2$, and $R^3$ comprises a halogen atom.

6. The process of claim 1, additionally comprising removing excess first reactant after contacting the substrate with the first vapor phase reactant and prior to contacting the substrate with the second vapor phase reactant.

7. The process of claim 1, wherein the first vapor phase reactant is a vapor phase halide reactant.

8. The process of claim 1, wherein the first vapor phase reactant does not comprise transition metal.

9. The process of claim 1, wherein the thin film is a Group III-V compound semiconductor film.

10. The process of claim 1, wherein the thin film comprises Bi, Bi—Te, Bi—Se, In—Bi, Ga—Bi, Al—Bi or combinations thereof.

11. The process of claim 1, wherein the first vapor phase reactant is not alcohol, water, or ozone.

12. An atomic layer deposition (ALD) process for forming a Bi-containing thin film on a substrate in a reaction chamber, the process comprising a plurality of deposition cycles comprising in order:
    contacting the substrate with a first vapor phase reactant;
    removing excess first reactant;
    contacting the substrate with a second vapor phase reactant, wherein the second vapor phase reactant comprises $Bi[A1(x^1R^1R^2R^3)_3]$ $[A^2(X^2R^4R^5R^6)_3]$ $[A^3(X^3R^7R^8R^9)_3]$, wherein $A^1$, $A^2$, and $A^3$ can be independently selected to be Si or Ge and wherein $R^1$, $R^2$, $R^3$, $R^4$, $R^5$, $R^6$, $R^7$, $R^8$, and $R^9$, can be independently selected to be alkyl, hydrogen, alkenyl, alkynyl or aryl groups and $X^1$, $X^2$, and $X^3$ can be independently selected to be Si, Ge, N, or O; and
    removing excess second reactant and reaction byproducts, if any, from the reaction chamber.

13. The process of claim 12, wherein the first vapor phase reactant comprises Ga, Se, Te, Cu, In or Al.

14. The process of claim 12, wherein the first vapor phase reactant comprises a halide reactant.

15. The process of claim 12, wherein the Bi-containing thin film comprises Bi, Bi—Te, Bi—Se, In—Bi, Ga—Bi, Al—Bi or combinations thereof.

16. The process of claim 12, wherein the second vapor phase reactant comprises $Bi[Si(SiR^1R^2R^3)_3]$ $[Si(SiR^4R^5R^6)_3]$ $[Si(SiR^7R^8R^9)_3]$.

17. The process of claim 12, wherein $X^1$, $X^2$ and $X^3$ are N and each N is $R_1$, $R^2$, $R^3$, $R^4$, $R^5$, $R^6$, $R^7$, $R^8$, and $R^9$ groups.

18. The process of claim 17, wherein the second vapor phase reactant comprises $Bi[Si(NR^1R^2)_3]$ $[Si(NR^3R^4)_3]$ $[Si(NR^5R^6)_3]$.

19. The process of claim 12, wherein $X^1$, $X^2$ and $X^3$ are O and each O is bound to one of the $R^1$, $R^R$, $R^3$, $R^4$, $R^5$, $R^6$, $R_7$, $R^8$, and $R^9$ groups.

20. The process of claim 19, wherein the second vapor phase reactant comprises $Bi[Si(OR^1)_3]$ $[Si(OR^2)_3]$ $[Si(OR^3)_3]$.

* * * * *